(12) United States Patent
Forbes et al.

(10) Patent No.: US 6,414,356 B1
(45) Date of Patent: *__Jul. 2, 2002__

(54) CIRCUITS AND METHODS FOR DUAL-GATED TRANSISTORS

(75) Inventors: Leonard Forbes, Corvallis, OR (US); Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 53 days.

This patent is subject to a terminal disclaimer.

(21) Appl. No.: 09/605,911

(22) Filed: Jun. 28, 2000

Related U.S. Application Data

(63) Continuation of application No. 09/050,281, filed on Mar. 30, 1998, now Pat. No. 6,097,065.

(51) Int. Cl.$^7$ .................. H01L 29/786; H01L 27/105
(52) U.S. Cl. ................... 257/350; 257/67; 257/74
(58) Field of Search ............... 257/350, 67, 64

(56) References Cited

U.S. PATENT DOCUMENTS

| | | | |
|---|---|---|---|
| 3,461,361 A | 8/1969 | Delivorias | 317/235 |
| 4,450,048 A | 5/1984 | Gaulier | 204/15 |
| 4,673,962 A | 6/1987 | Chatterjee et al. | 357/23.6 |
| 4,922,315 A | 5/1990 | Vu | 357/35 |
| 4,987,089 A | 1/1991 | Roberts | 437/34 |
| 4,996,574 A | 2/1991 | Shirasaki | 357/23.7 |
| 5,006,909 A | 4/1991 | Kosa | 357/23.6 |
| 5,021,843 A | 6/1991 | Ohmi | 357/23.1 |
| 5,023,688 A | 6/1991 | Ando et al. | 357/42 |
| 5,097,381 A | 3/1992 | Vo et al. | 361/313 |
| 5,122,848 A | 6/1992 | Lee et al. | 357/23.6 |
| 5,250,450 A | 10/1993 | Lee et al. | 437/40 |
| 5,315,143 A | 5/1994 | Tsuji | 257/351 |
| 5,350,934 A | 9/1994 | Matsuda | 257/139 |
| 5,379,255 A | 1/1995 | Shah | 365/185 |
| 5,453,636 A | 9/1995 | Eitan et al. | 257/378 |
| 5,491,356 A | 2/1996 | Dennison et al. | 257/306 |
| 5,508,544 A | 4/1996 | Shah | 257/316 |
| 5,528,062 A | 6/1996 | Hsieh et al. | 257/298 |
| 5,541,432 A | 7/1996 | Tsuji | 257/350 |
| 5,554,870 A | 9/1996 | Fitch et al. | 257/334 |
| 5,581,104 A | 12/1996 | Lowrey et al. | |
| 5,585,998 A | 12/1996 | Kotecki et al. | 361/321.4 |
| 5,587,665 A | 12/1996 | Jiang | 326/16 |
| 5,646,900 A | 7/1997 | Tsukude et al. | 365/205 |
| 5,680,345 A | 10/1997 | Hsu et al. | 365/185.01 |
| 5,691,230 A | 11/1997 | Forbes | 437/62 |
| 5,796,143 A | 8/1998 | Fulford, Jr. et al. | 257/330 |
| 5,796,166 A | 8/1998 | Agnello et al. | 257/751 |
| 5,892,260 A | 4/1999 | Okumura et al. | 257/347 |
| 5,969,388 A | 10/1999 | Kishi | 257/350 |
| 6,075,272 A | 6/2000 | Forbes et al. | 257/378 |
| 6,107,663 A | 8/2000 | Noble et al. | 257/351 |
| 6,160,275 A | 12/2000 | Nishio et al. | 257/206 |

FOREIGN PATENT DOCUMENTS

| | | | |
|---|---|---|---|
| EP | 0431855 | 6/1991 | H01L/29/772 |

OTHER PUBLICATIONS

Blalock, T.N., et al., "A High–speed Sensing Scheme for 1T Dynamic RAMs Utilizing the Clamped Bit–line Sense Amplifier", *IEEE Journal of Solid–State Circuits*, 27 (4), 618–625, (Apr., 1992).

(List continued on next page.)

Primary Examiner—Jerome Jackson, Jr.
(74) Attorney, Agent, or Firm—Schwegman, Lundberg, Woessner & Kluth, P.A.

(57) ABSTRACT

A circuit and method for an improved inverter is provided. The present invention capitalizes on a switched source impedance to prevent subthreshold leakage current at standby in low voltage CMOS circuits. The switched source impedance is provided by dual-gated transistors. The dual gates of the transistors are biased to modify the threshold voltage of the transistors ($V_t$). This design provides fast switching capability for low power battery operated CMOS circuits and systems. The devices can be used in a variety of applications, digital and analog, wherever a more compact structure with low power consumption and fast response time is needed.

28 Claims, 28 Drawing Sheets

OTHER PUBLICATIONS

Chen, M.J., et al., "Back–Gate Forward Bias Method for Low–Voltage CMOS Digital Circuits", *IEEE Transactions on Electron Devices*, 43, 904–909, (Jun. 1996).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17 (11), 509–511, (Nov. 1996).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horiguchi, et al., "Switched–Source–Impedance CMOS Circuit for Low Standby Subthreshold Current Giga–Scale LSIs", *IEEE Journal of Solid State Circuits*, vol. 28, 1131–1135, (1993).

Huang, W.L., et al., "TFSOI Complementary BiCMOS Technology for Low Power Applications", *IEEE Transactions on Electron Devices*, 42, 506–512, (Mar. 1995).

Ko, et al., "High–gain Lateral Bipolar Action in a MOSFET Structure", *IEEE Trans. on Electron Devices*, vol. 38, No. 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Parke, S.A., et al., "A High–Performance Lateral Bipolar Transistor Fabricated on SIMOX", *IEEE Electron Device Letters*, 14, 33–35, (Jan. 1993).

Rabaey, *Digital Integrated Circuits*, Prentice Hall, Englewood Cliffs, NJ, 222–232, (1996).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High-Speed VLSI Circuits with Application to Current Sense Amplifier for CMOS SRAM's", *IEEE Journal of Solid State Circuits*, 26 (4), pp. 525–536, (Apr. 1991).

Shimomura, K., et al., "A 1V 46ns 16Mb SOI–DRAM with Body Control Technique", *1997 IEEE International Solid-State Circuits Conference, Digest of Technical Papers*, 68–69, (Feb. 6, 1997).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Tuinega, *A Guide to Circuit Simulation and Analysis Using PSPICE*, Prentice Hall, Englewood Cliffs, NJ, (1988).

Wolf, S., *In: Silicon Processing for the VLSI Era, Volume 2: Process Integration*, Lattice Press, Sunset Beach, CA, 389–392, (1990).

Wong, et al., "A 1V CMOS Digital Circuits with Double-–Gate Driven MOSFET", *IEEE Int. Solid State Circuits Conference*, San Francisco, 292–93, (1997).

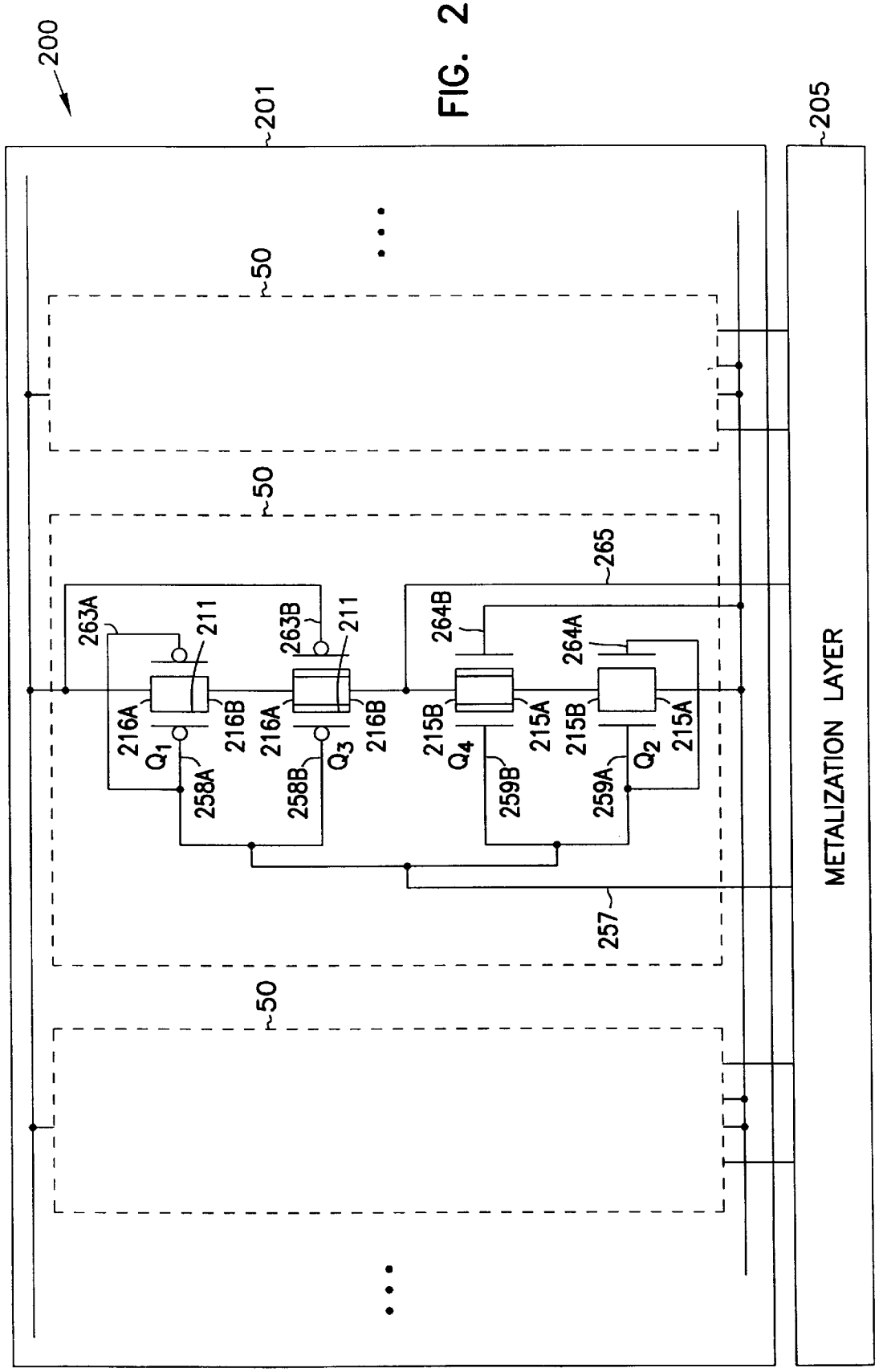

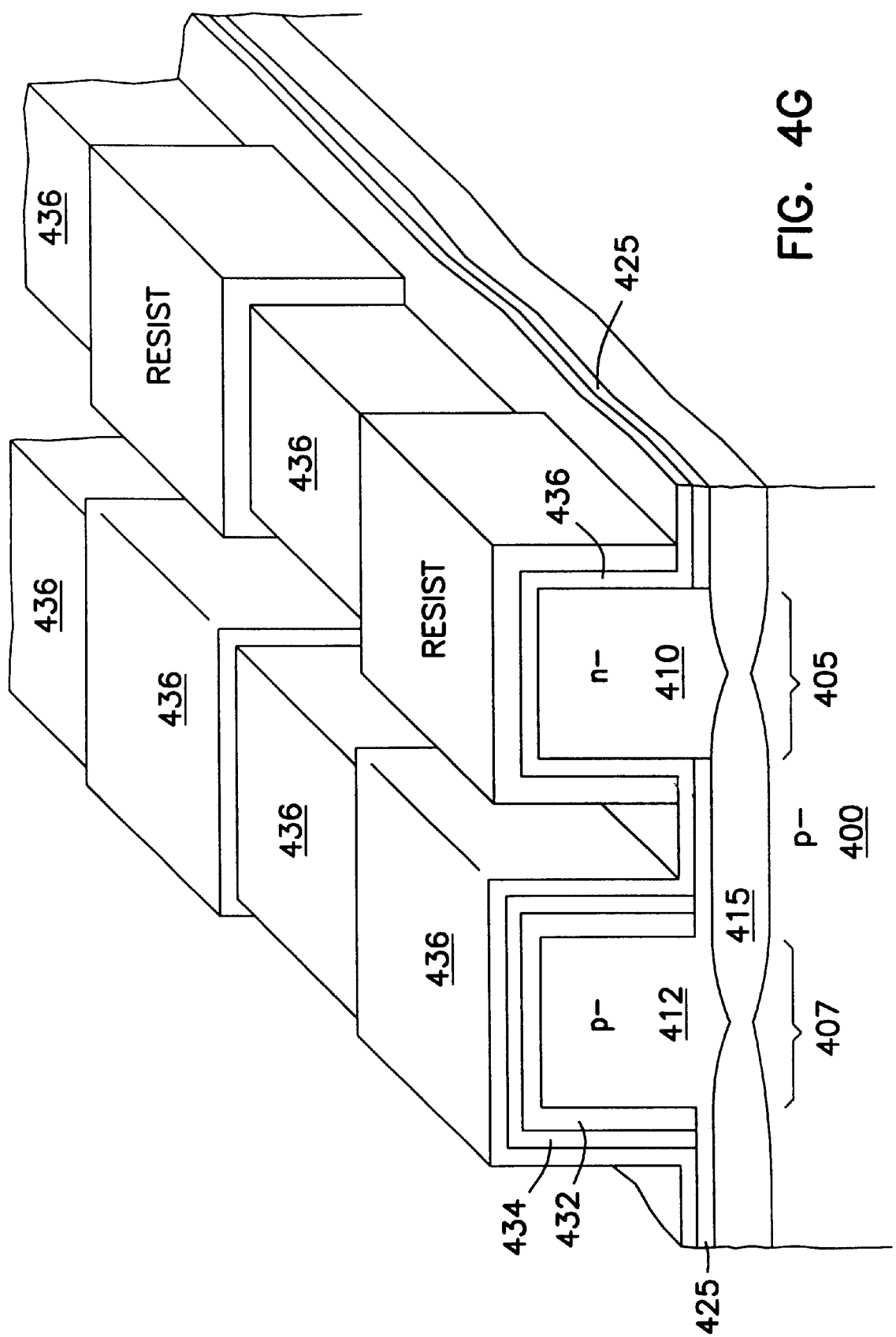

CIRCUITS AND METHODS FOR DUAL-GATED TRANSISTORS

This application is a continuation of U.S. Ser. No. 09/050,281, filed Mar. 30, 1998, now U.S. Pat. No. 6,097,065.

RELATED APPLICATIONS

This application is related to the co-filed and commonly assigned applications, attorney docket number 303.478us1, entitled "Circuits and Methods for Body Contacted and Backgated Transistors," and attorney docket number 303.498us1, entitled "Another Technique for Gated Lateral Bipolar Transistors" which are hereby incorporated by reference.

FIELD OF THE INVENTION

The present invention relates generally to semiconductor integrated circuits. More particularly, it pertains to circuits and methods for dual-gated transistors.

BACKGROUND OF THE INVENTION

Integrated circuit technology relies on transistors to formulate vast arrays of functional circuits. The complexity of these circuits requires the use of an ever increasing number of linked transistors. As the number of transistors required increases, the surface area that can be dedicated to a single transistor dwindles. It is desirable then, to construct transistors which occupy less surface area on the silicon chip/die.

Integrated circuit technology uses transistors conjunctively with Boolean algebra to create a myriad of functional digital circuits, also referred to as logic circuits. In a typical arrangement, transistors are combined to switch or alternate an output voltage between just two significant voltage levels, labeled logic 0 and logic 1. Most logic systems use positive logic, in which logic 0 is represented by zero volts, or a low voltage, e.g., below 0.5 V; and logic 1 is represented by a higher voltage.

One method in which these results are achieved involves Complementary Metal-Oxide Semiconductor (CMOS) technology. CMOS technology comprises a combination of oppositely doped Metal-Oxide Semiconductor Field-Effect Transistors (MOSFETs) to achieve the switching mechanism between voltage levels associated with logic 0 and that of logic 1. This configuration is likewise referred to as an inverter. Conventional CMOS inverters consume an appreciable amount of chip surface area, even despite ongoing reductions in the critical dimensions that are achievable with conventional photolithography techniques. The critical dimension (F) represents the minimum lithographic feature size that is imposed by lithographic processes used during fabrication. It is one objective, then, to fabricate CMOS inverters which conserve silicon chip surface space.

Standby current is another significant concern and problem in low voltage and low power battery operated CMOS circuits and systems. High threshold voltage transistors and high power supply voltages were traditionally employed in part to minimize subthreshold leakage at standby. Today, however, low voltages are desired for low power operation. This creates a problem with threshold voltages and standby leakage current. In order to get significant overdrive and reasonable switching speeds the threshold voltage ($V_t$) magnitudes must be small, e.g. zero volts. However, having such low threshold voltages generally uses one of the transistors to have a large subthreshold leakage current Various techniques have been employed to allow low voltage operation with CMOS transistors and to maintain low subthreshold leakage currents at standby. Dynamic CMOS circuits achieve this objective by using clock or phase voltages to turn off conduction from the power supply to ground through the chain of devices when the inverter is at standby. Synchronous body bias has similarly been employed in part to minimize subthreshold leakage. However, synchronous body bias, like dynamic logic, requires extra clock or phase voltage lines throughout the circuit. This increases considerably the complexity of circuits and consumes precious space on the chip. Also, data stored only on a dynamic basis must be clocked and refreshed.

Another way to get around these problems involves implementing resistors to provide a source to substrate bias or backgate bias when the transistor is in the off state. This reverse bias is also termed a "switched source impedance." The resistor technique is effective for reducing subthreshold leakage current at standby. However, the problem with this method is that resistors are troublesome to fabricate in CMOS process steps.

For the reasons stated above, and for other reasons stated below which will become apparent to those skilled in the art upon reading and understanding the present specification, there is a need for improved inverter devices. The improved inverters should desirably minimize subthreshold leakage current and conserve chip surface space while continuing to advance the operation speeds in logic circuits. The improved inverter circuits and structures should remain fully integral with CMOS processing techniques.

SUMMARY OF THE INVENTION

The above mentioned problems with memory devices and other problems are addressed by the present invention and will be understood by reading and studying the following specification. A circuit and method is provided to minimize subthreshold leakage currents at standby in low power CMOS circuits and systems.

In particular, an illustrative embodiment of the present invention includes an inverter. The inverter includes a first, second, third and fourth transistor which all extend outwardly from a semiconductor substrate. The transistors each have an upper surface and opposing sidewall surfaces. The transistors each have a source/emitter region, a body/base region, a collector/drain region, a few gate on a first one of the opposing sidewall surfaces, and a second gate on a second one of the opposing sidewall surfaces. There is an electrical contact between the collector/drain regions of the second and third transistors to provide an output for the inverter. A gate contact interconnects the transistors wherein the gate contact provides an input to the inverter.

In another embodiment, an inverter array is provided. The inverter array includes multiple inverters formed in an array. Each inverter includes the structure disclosed above. A metallization layer selectively interconnects the inputs and outputs of the inverters to form a logic circuit that accepts inputs and produces one or more logical outputs.

In another embodiment, an input/output device is provided. The input/output device includes a functional circuit which has a plurality of components. A logic device couples to the functional circuit. The logic device has a number of inverters formed in an array. Each inverter includes the structure disclosed above. The logic device includes a metallization layer that selectively interconnects the inputs and outputs of the inverters to form a logic circuit that accepts inputs and produces one or more logical outputs.

In another embodiment, a method of fabricating an inverter is provided. The method includes forming a first, second, third and fourth transistor. Each transistor extends outwardly from a semiconductor substrate. The transistors are each formed to have an upper surface and opposing sidewall surfaces. Each transistor is formed with a source/emitter region, a body/base region, a collector/drain region, a first gate formed on a first one of the opposing sidewall surfaces, and a second gate formed on a second one of the opposing sidewall surfaces. The method further includes forming an electrical contact between collector/drain regions of the second and third transistors to provide an output for the inverter. A gate contact is formed that interconnects the transistors and provides an input to the inverter.

In another embodiment, an inverter circuit is provided. The inverter circuit includes a complementary pair of transistors. The complementary pair includes a first channel type transistor and a second channel type transistor. Each transistor includes a body region formed of single crystalline semiconductor material and that extends outwardly from a substrate. The body region has an upper surface and opposing sidewalls. A source/emitter region is formed within a portion of the upper surface of the body region. A collector/drain region is formed within a portion of the upper surface of the body region. A first gate is formed on a first one of the opposing sidewalls. A second gate is formed on a second one of the opposing sidewalls. There is an electrical contact between collector/drain regions of the complementary pair to provide an output for the inverter. A gate contact interconnects the first gates of the complementary pair and serves as an input to the inverter.

In another embodiment, a method of fabricating an inverter is provided. The method includes forming a complementary pair of transistors. The complementary pair includes a first channel type transistor and a second channel type transistor. Forming each transistor includes forming a body region formed of single crystalline semiconductor material which extends outwardly from a substrate. The body region has an upper surface and opposing sidewalls. A source/emitter region is formed within a portion of the upper surface of the body region. A collector/drain region is formed within a portion of the upper surface of the body region. A first gate is formed on a first one of the opposing sidewalls. A second gate is formed on a second one of the opposing sidewalls. The method further includes forming an electrical contact between collector/drain regions of the complementary pair to provide an output for the inverter. The method also includes forming a gate contact to interconnect the first gates of the complementary pair and serve as an input to the inverter.

In another embodiment, an information handling system is provided. The information handling system includes a central processing unit, a random access memory, and a system bus. The system bus communicatively couples the central processing unit to the random access memory. The central processing unit (CPU) further includes an inverter which has the structure describe above.

Thus, improved inverter structures are provided along with circuits and methods for the same. These new inverter structures provide for low voltage operation and enhanced switching action over conventional complementary metaloxide semiconductor (CMOS) devices. These improved inverter structures significantly reduce standby leakage current in low power operation devices. Forming the inverter structures is fully compatible with CMOS processing technology. The inverter structures additionally conserve precious chip surface space.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 2 is a schematic diagram illustrating an inverter array included as part of a logic circuit according to the teachings of the present invention.

DETAILED DESCRIPTION

Figure 1A:
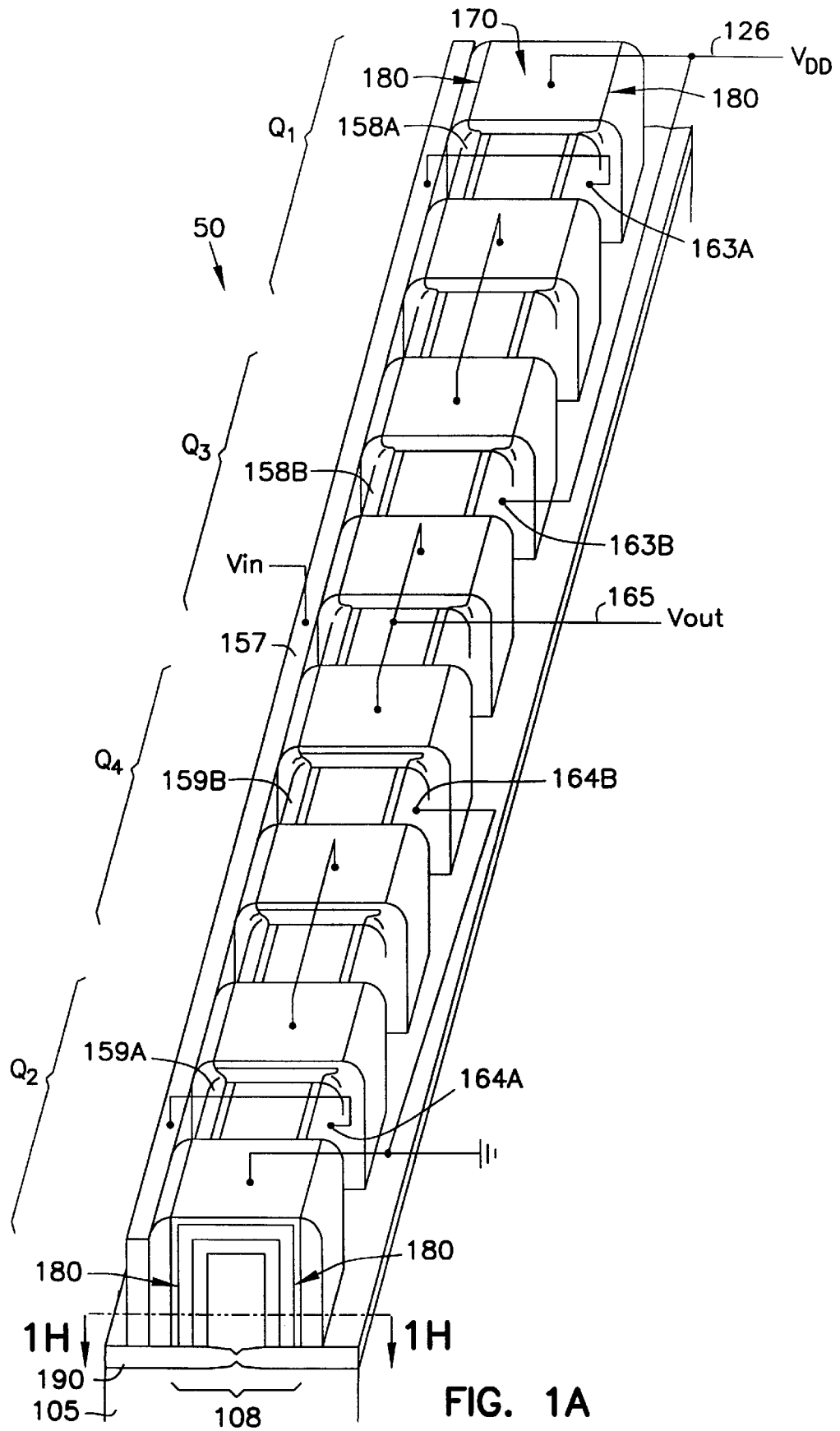
FIG. 1A is a perspective view illustrating a first embodiment of an inverter according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are fined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

First Inverter Embodiment

FIG. 1A is a perspective view illustrating generally an embodiment of an inverter according to the teachings of the present invention. The inverter 50 is a four transistor device that is formed using, for example, the technique described below with respect to FIGS. 4A through 4O. The transistors which make up the inverter 50 are formed of single crystalline semiconductor material. The transistors all have an upper surface 170 and opposing sidewall surfaces 180. Each transistor in inverter 50 is either an n-channel metal-oxide semiconductor (NMOS) or a p-channel metal-oxide semiconductor (PMOS). The inverter 50 includes two NMOS transistors, $Q_2$ and $Q_4$ respectively. The NMOS transistors, $Q_2$ and $Q_4$, are coupled to one another. Also, the inverter 50 includes two PMOS transistors, $Q_1$ and $Q_3$ respectively. The PMOS transistors, $Q_1$ and $Q_3$, are likewise coupled to one another. In the exemplary embodiment, NMOS transistors $Q_2$ and $Q_4$ possess different doping profiles such that transistor $Q_2$ has a higher threshold voltage ($V_t$) than transistor $Q_4$. PMOS transistors $Q_1$ and $Q_3$ possess different doping profiles such that transistor $Q_1$ has a higher threshold voltage ($V_t$) than transistor $Q_3$. NMOS transistors, $Q_2$ and $Q_4$, include first gates 159A and 159B respectively, on a first one of the opposing sidewall surfaces 180. PMOS transistors, $Q_1$ and $Q_3$, include first gates, 158A and 158B respectively, on a first one of the opposing sidewall surfaces 180. In one embodiment, the NMOS first gates, 159A and 159B, are formed of n+ silicon material and the PMOS first gates, 158A and 158B, are formed of p+ silicon material. NMOS transistors, $Q_2$ and $Q_4$, include second gates, 164A and 164B respectively, on a second one of the opposing sidewall surfaces 180. PMOS transistors, $Q_1$ and $Q_3$, include second gates, 163A and 163B respectively, on a second one of the opposing sidewall surfaces 180. In one embodiment, the NMOS second gates, 164A and 164B, are formed of n+ silicon material and the PMOS second gates, 163A and 163B, are formed of p+ silicon material. The second gates, 164B and 163B, of transistors $Q_4$ and $Q_3$ couple to external potential values. Inverter 50 also includes a gate contact 157 which couples to all of the first gates, 159A, 159B, 158A, and 158B respectively, of the NMOS and PMOS transistors. Inverter 50 includes an electrical contact 165 which couples to transistors $Q_4$ and $Q_3$ and provides an output to the inverter 50. In one embodiment, inverter 50 is formed on an insulator layer 190 formed on a substrate 105 of p− silicon material. In one embodiment, gate contact 157 further couples to the second gates, 164A and 163A, of transistors $Q_2$ and $Q_1$.

Figure 1B:
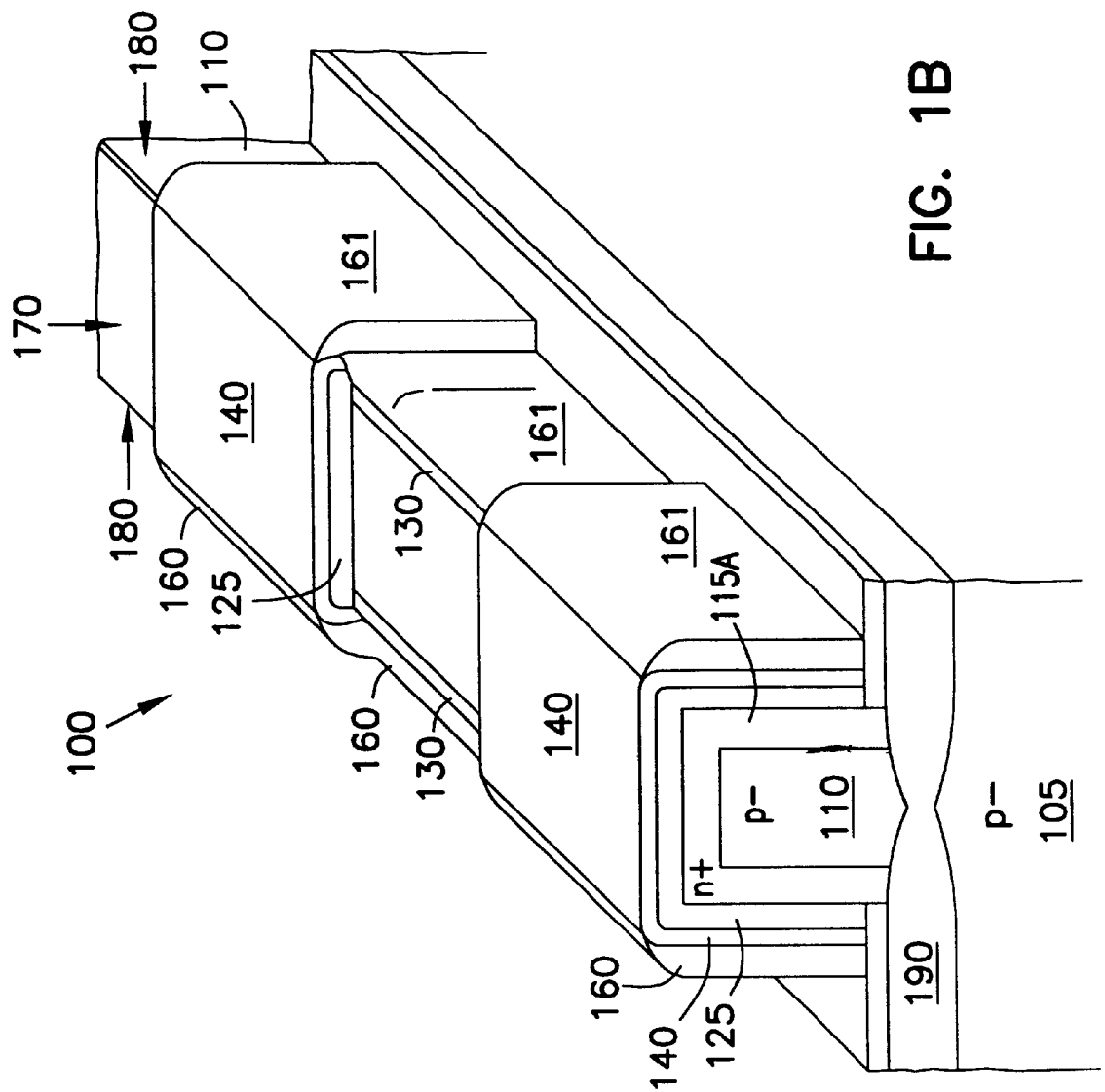
FIG. 1B is a perspective view intended to provide an illustrative example of an individual NMOS transistor as employed in the inverter of FIG. 1A.
Figure 1C:
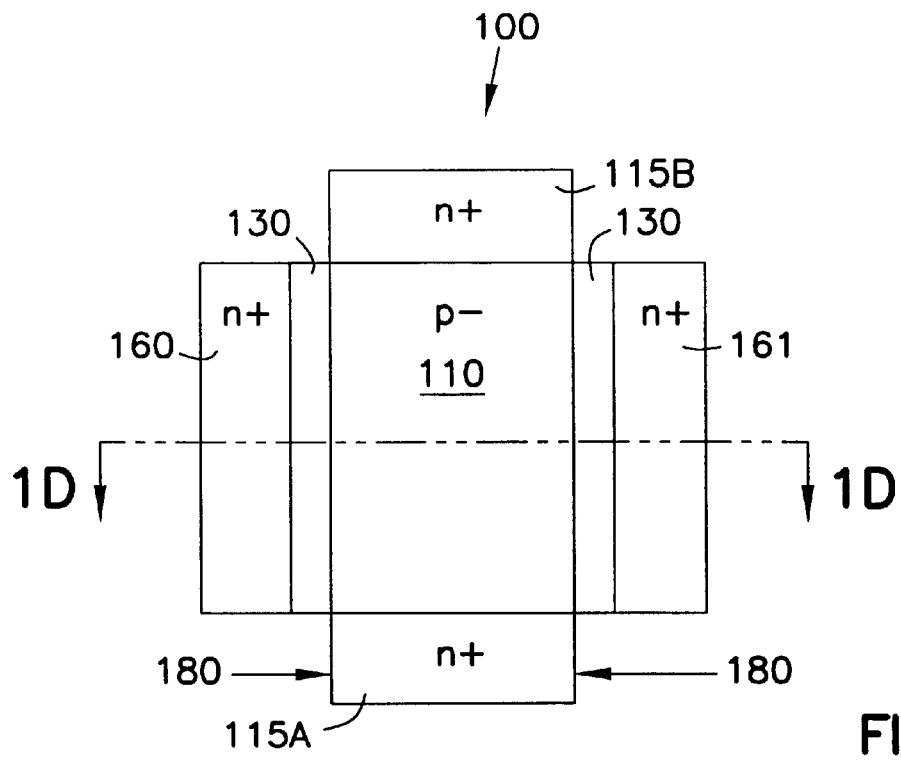
FIG. 1C is a top view of the transistor shown in FIG. 1B.

FIG. 1B is a perspective view intended to provide an illustrative example of an individual NMOS transistor 100 as employed in the inverter 50 of FIG. 1A. The NMOS transistor 100 represents either transistor $Q_2$ or $Q_4$ in inverter 50 depending on the NMOS transistor's doping profile. The NMOS transistor 100 includes a body region 110 formed of single crystalline semiconductor material that extends outwardly from a substrate 105. In one embodiment, the body region 110 is formed on an insulator layer 190 formed on a substrate 105 formed of p− silicon material. The body region 110 has an upper surface 170 and opposing sidewall surfaces 180. In one embodiment, the NMOS body region 110 is formed of a p− silicon material. A source/emitter region 115A is formed within the upper surface 170 and the opposing sidewall surfaces 180 of the body region 110 of the NMOS transistor 100. Similarly, a collector/drain region 115B, as shown in FIG. 1C, is formed within the upper surface 170 and the opposing sidewall surfaces 180 of the body region 110 of the NMOS transistor 100. A doped glass layer 125 encases both the source/emitter region 115A and the collector/drain region 115B for the transistor. In one embodiment the doped glass layer 125 is Arsenic silicate glass (ASG), and in another embodiment, the doped glass layer is phosphorus silicate glass (PSG). A thin nitride layer 140 encases the doped glass layer 125 over the source/emitter region 115A and the collector/drain region 115B. The NMOS transistor 100 further includes a gate oxide layer 130 located on the opposing sidewalls 180. A first gate 160 is formed on the gate oxide 130 on the first one of the opposing sidewalls 180. Gate 160 correlates to either gate 159A or 159B of FIG. 1A depending on the gate's 160 doping profile. A second gate 161 is located on the gate oxide 130 on the other of the opposing sidewall surfaces 180. Gate 161 correlates to either gate 164A or 164B of FIG. 1A depending on the gate's 161 doping profile.

FIG. 1C is a top view of the transistor shown in FIG. 1B with the nitride layer 140 and the doped glass layer 125 cut away for illustrative purposes. FIG. 1C illustrates the source/emitter region 115A and the collector/drain region 115B. FIG. 1C also illustrates the gate oxide 130 located on the opposing sidewall surfaces 180. The first gate 160 is shown on the gate oxide 130 on a first one of the opposing sidewall surfaces. The second gate 161 is shown on the gate oxide 130 on the other one of the opposing sidewall surfaces 180.

Figure 1D:
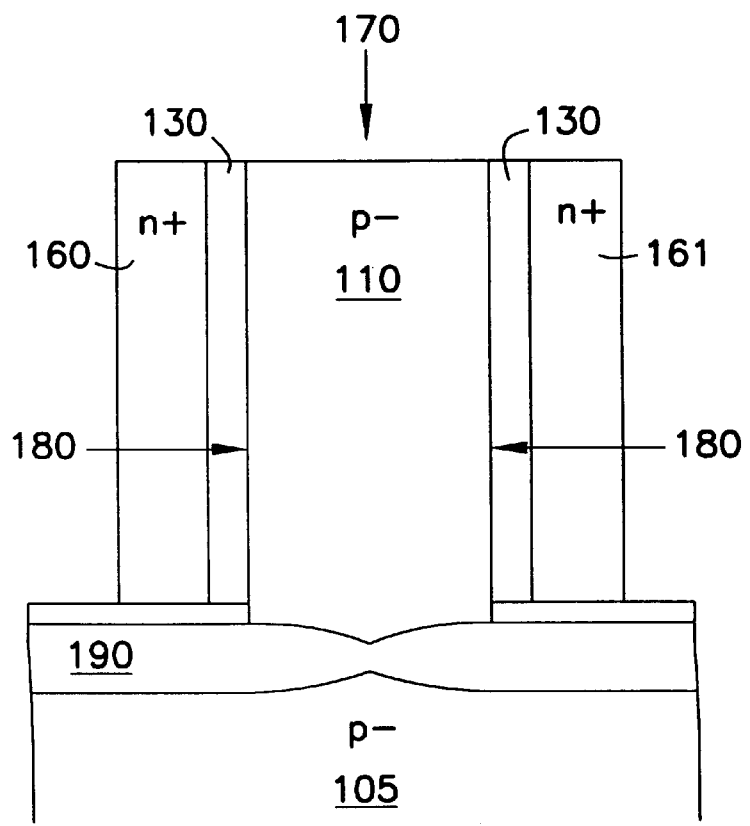
FIG. 1D is a cross-sectional view taken along cut line 1D—1D of FIG. 1C.

FIG. 1D is a cross-sectional view taken along cut line 1D—1D of FIG. 1C. This cross-sectional view provides another illustration of the first gate 160 formed on the gate oxide 130 on one of the opposing sidewall surfaces 180. The view likewise shows the second gate 161 on the gate oxide 130 on the other opposing sidewall 180. In one embodiment, the first gate 160 and the second gate 161 are biased independently from one another. In an alternative embodiment, the first gate 160 and the second gate 161 are coupled to a single source potential.

Figure 1E:
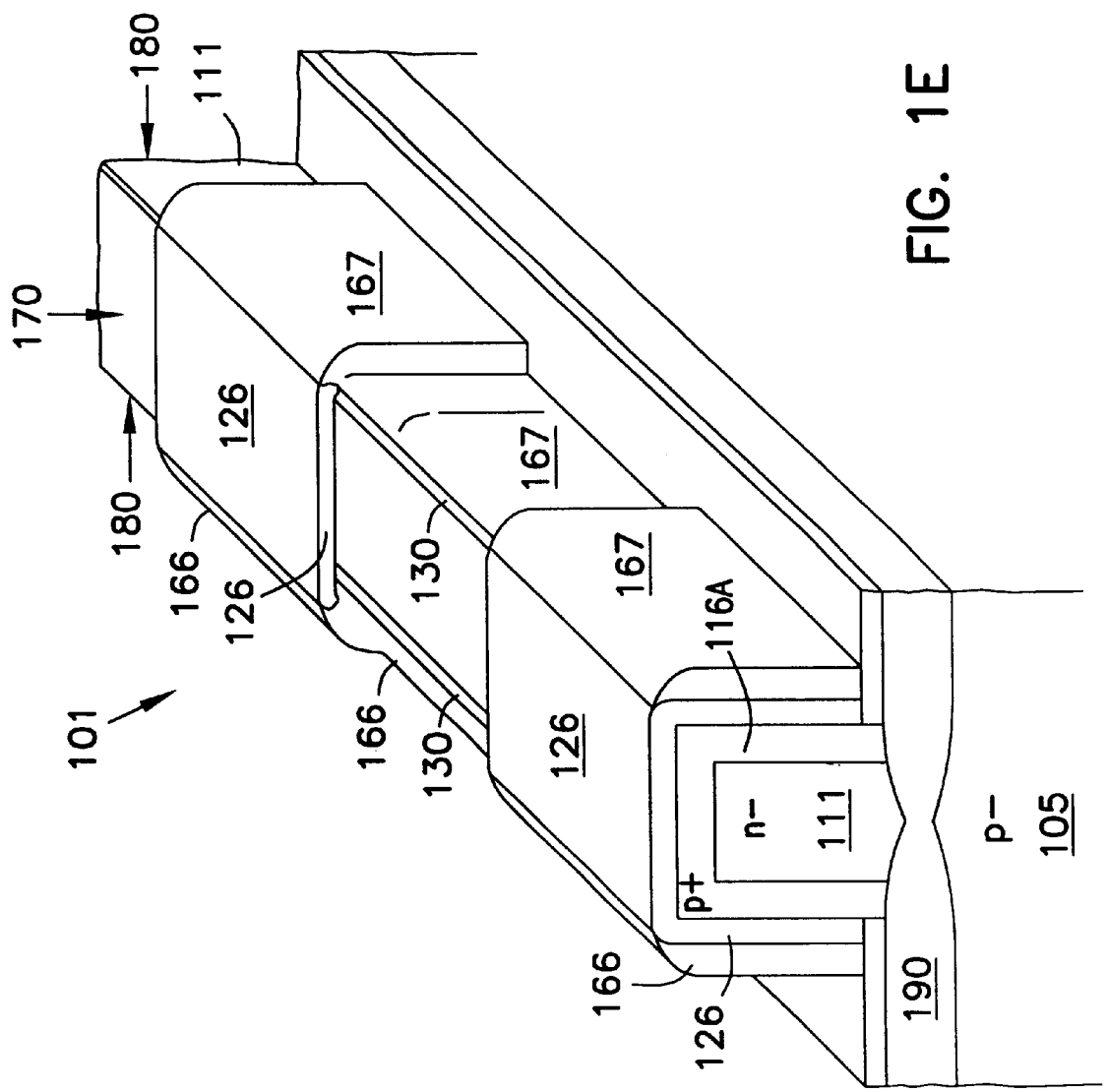
FIG. 1E is a perspective intended to provide an illustrative example of an individual PMOS transistor as employed in the inverter of FIG. 1A.
Figure 1F:
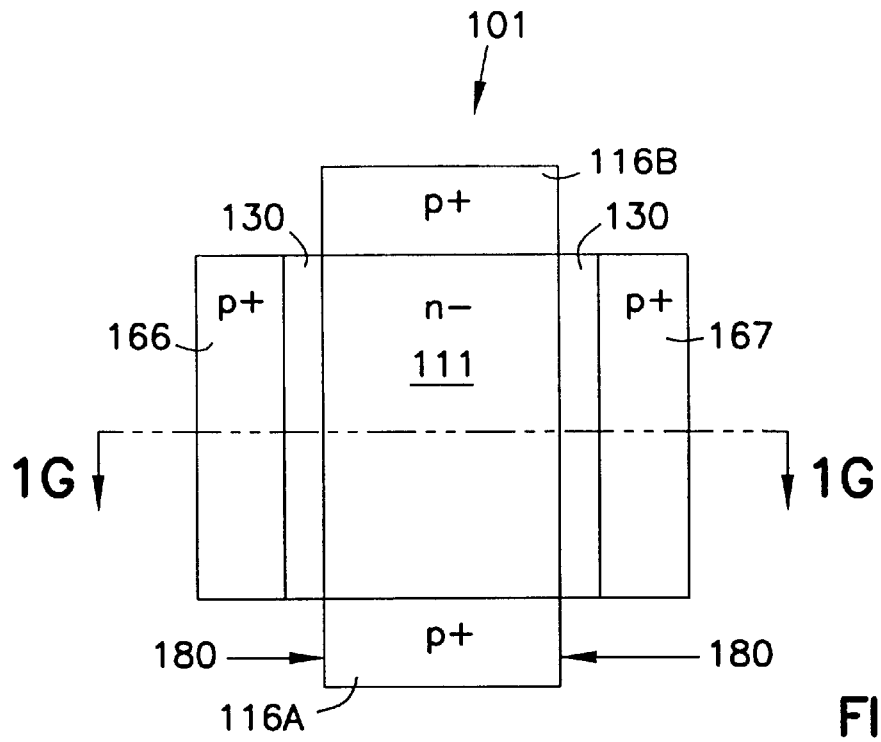
FIG. 1F is a top view of the transistor shown in FIG. 1E.

FIG. 1E is a perspective intended to provide an illustrative example of an individual PMOS transistor 101 as employed in the inverter 50 of FIG. 1A. The PMOS transistor 101 represents either transistor $Q_1$ or $Q_3$ in inverter 50 depending on the PMOS transistor's 101 doping profile. The PMOS transistor 101 includes a body region 111 formed of single crystalline semiconductor material that extends outwardly from a substrate 105. In one embodiment, the body region 111 is formed on an insulator layer 190 formed on a substrate 105 formed of p- silicon material. The body region 111 has an upper surface 170 and opposing sidewall surfaces 180. In one embodiment, the PMOS body region 111 is formed of an n- silicon material. A source/emitter region 116A is formed within the upper surface 170 and the opposing sidewall surfaces 180 of the body region 111 of the PMOS transistor 101. Similarly, a collector/drain region 116B, as shown in FIG. 1F, is formed within the upper surface 170 and the opposing sidewall surfaces 180 of the body region 111 of the PMOS transistor 101. A doped glass layer 126 encases both the source/emitter region 116A and the collector/drain region 116B for the transistor. In one embodiment the doped glass layer 126 is borosilicate glass (BSG). The PMOS transistor 101 further includes a gate oxide layer 130 located on the opposing sidewalls 180. A first gate 166 is formed on the gate oxide 130 on the first one of the opposing sidewalls 180. Gate 166 correlates to either gate 158A or 158B of FIG. 1A depending on the gate's 166 doping profile. A second gate 167 is located on the gate oxide 130 on the other of the opposing sidewall surfaces 180. Gate 167 correlates to either gate 163A or 163B of FIG. 1A depending on the gate's 167 doping profile.

FIG. 1F is a top view of the transistor shown in FIG. 1E with the doped glass layer 126 cut away for illustrative purposes. FIG. 1F illustrates the source/emitter region 116A and the collector/drain region 116B. FIG. 1F also illustrates the gate oxide 130 located on a first one of the opposing sidewall surfaces 180. The first gate 166 is formed on the gate oxide 130. The second gate 167 is shown on the gate oxide 130 on the other one of the opposing sidewall surfaces 180.

Figure 1G:
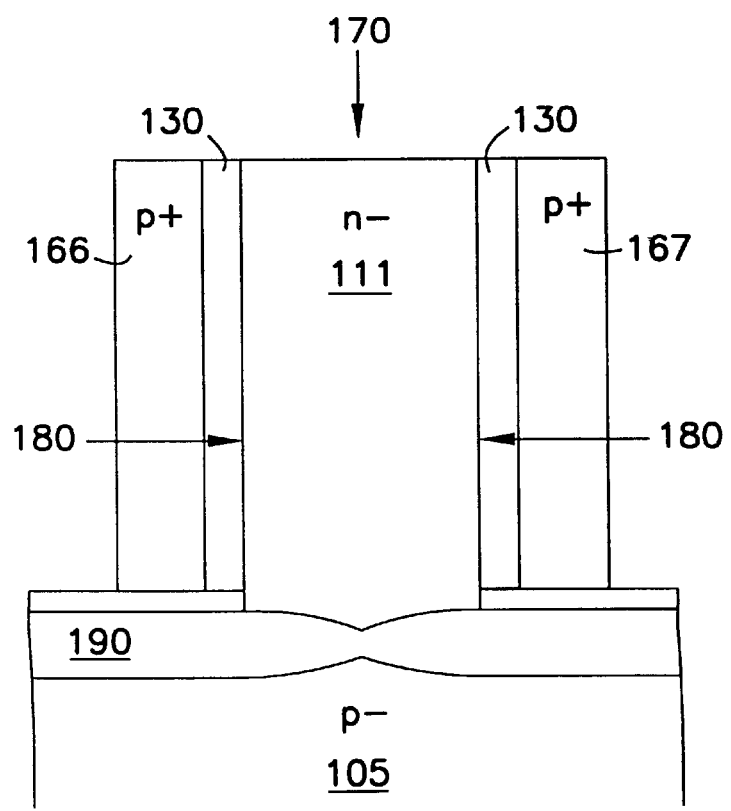
FIG. 1G is a cross-sectional view of the transistors shown in FIG. 1F, taken along cut line 1G—1G.

FIG. 1G is a cross-sectional view taken along cut line 1G—1G of FIG. 1F. This cross-sectional view provides another illustration of the first gate 166 formed on the gate oxide 130 on one of the opposing sidewall surfaces 180. The view likewise shows the second gate 167 on the gate oxide 130 on the other opposing sidewall 180. In one embodiment, the first gate 166 and the second gate 167 are biased independently from one another. In an alternative embodiment, the first gate 166 and the second gate 167 are coupled to a single source potential.

Figure 1H:
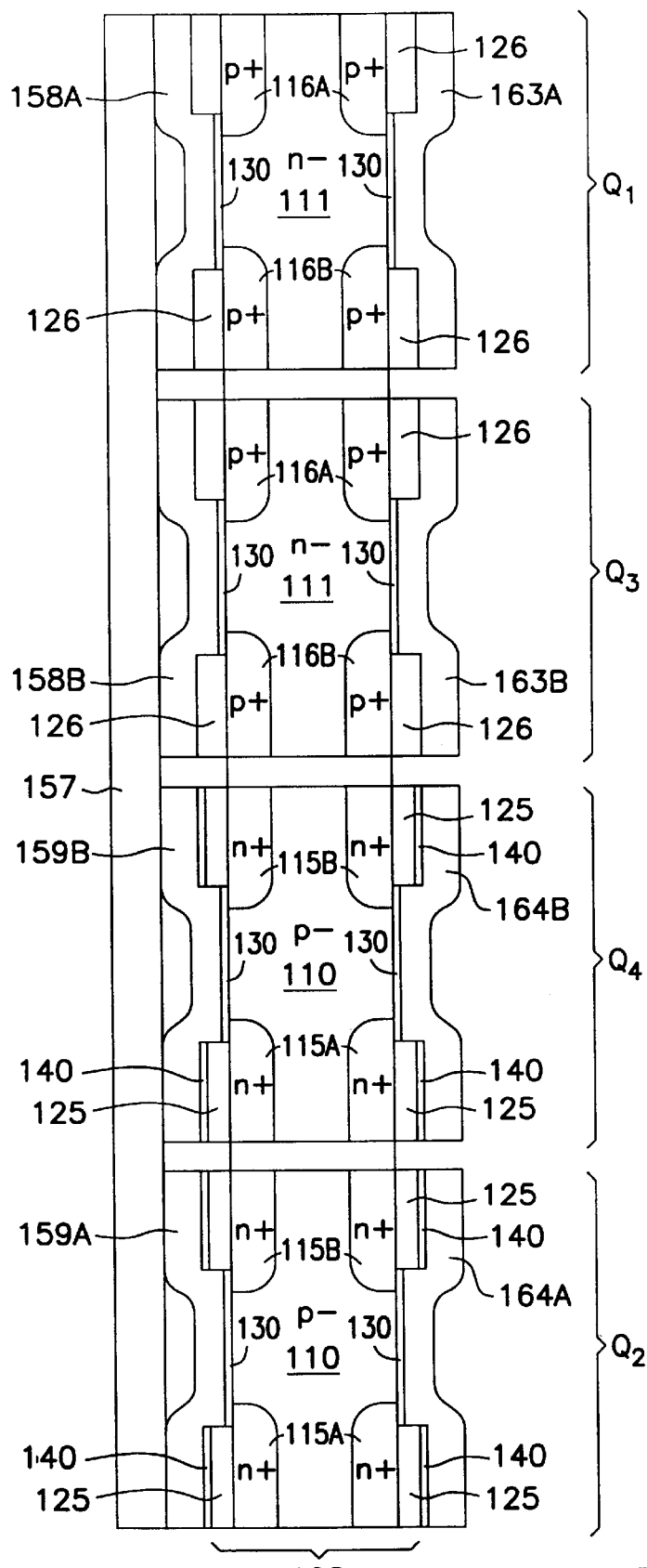
FIG. 1H is a cross-sectional view taken along cut line 1H—1H of FIG. 1A.

FIG. 1H is a cross-sectional view taken along cut line 1H—1H of FIG. 1A. FIG. 1H illustrates all four transistors, $Q_2$, $Q_4$, $Q_3$, and $Q_1$, coupled together via gate contact 157. FIG. 1H illustrates more clearly the first gates, 159A and 159B respectively, of transistors $Q_2$ and $Q_4$, coupled to the gate oxides 130 on one of the opposing sidewall surfaces 180. FIG. 1H shows that the first gates, 159A and 159B respectively, of transistors $Q_2$ and $Q_4$ are separated from coupling to the source/emitter regions 115A and the collector/drain regions 115B by both a nitride layer 140 and doped glass layers 125. Similarly, FIG. 1H illustrates more clearly the second gates, 164A and 164B respectively, of transistors $Q_2$ and $Q_4$, coupled to the gate oxides 130 on the other of the opposing sidewall surfaces 180. FIG. 1H shows that the second gates, 164A and 164B respectively, of transistors $Q_2$ and $Q_4$ are also separated from coupling to the source/emitter regions 115A and the collector/drain regions 115B by both a nitride layer 140 and doped glass layers 125.

FIG. 1H illustrates a similar arrangement for the PMOS transistors, $Q_1$ and $Q_3$ respectively. FIG. 1H shows more clearly the first gates, 158A and 158B respectively, of transistors $Q_1$ and $Q_3$, coupled to the gate oxides 130 on one of the opposing sidewall surfaces 180. FIG. 1H shows that the first gates, 158A and 158B respectively, of transistors $Q_1$ and $Q_3$, are separated from coupling to the source/emitter regions 116A and the collector/drain regions 116B by doped glass layers 126. Similarly, FIG. 1H illustrates more clearly the second gates, 163A and 163B respectively, of transistors $Q_1$ and $Q_3$, coupled to the gate oxides 130 on the other of the opposing sidewall surfaces 180. FIG. 1H shows that the second gates, 163A and 163B respectively, of transistors $Q_1$ and $Q_3$ are also separated from coupling to the source/emitter regions 116A and the collector/drain regions 116B by the doped glass layers 126.

Figure 1I:
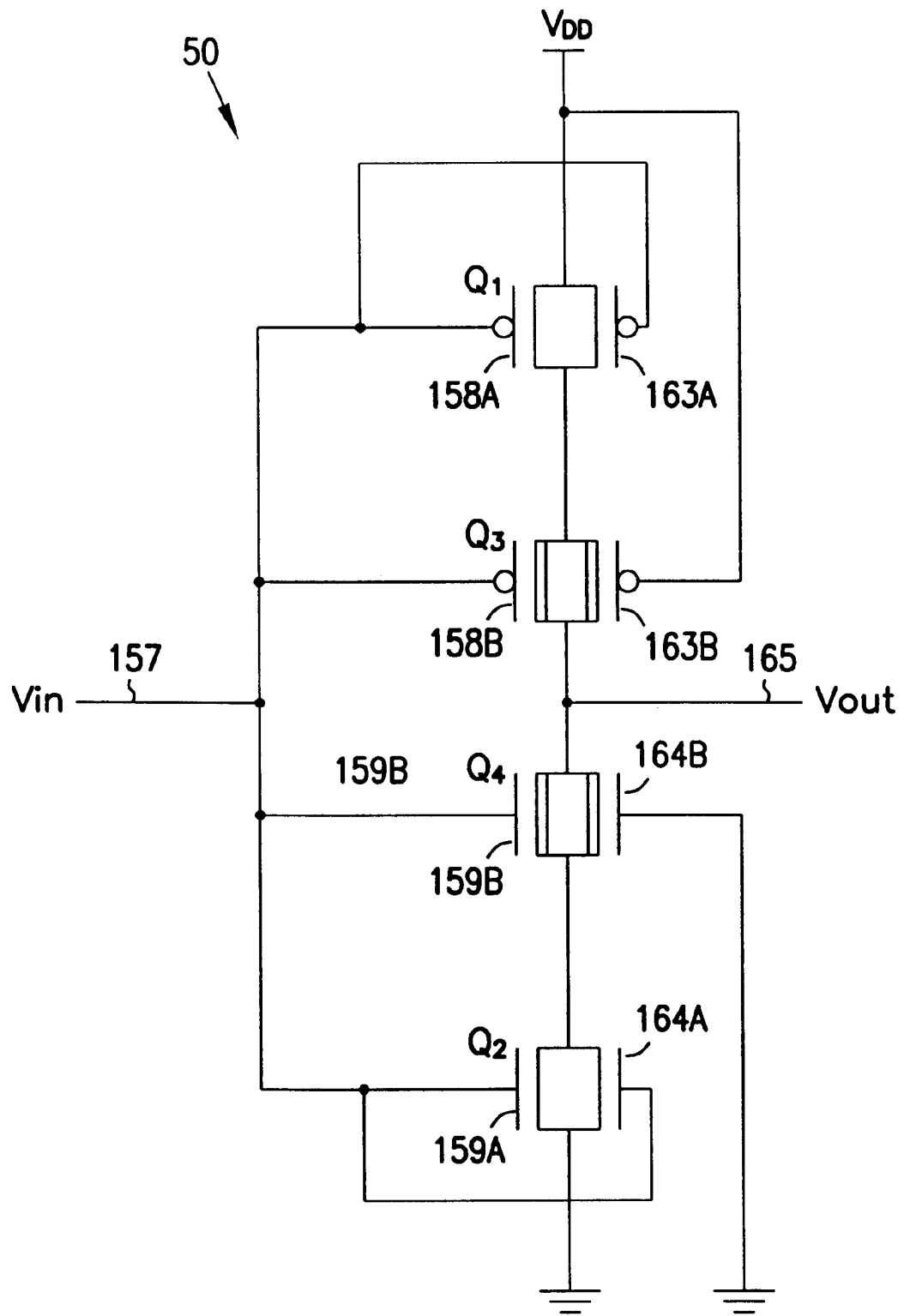
FIG. 1I is a schematic diagram of an inverter according to the teachings of the present invention.

FIG. 1I is a schematic diagram of an inverter 50 according to the teachings of the present invention. The operation of the embodiment of FIG. 1A is described in connection with the schematic diagram of FIG. 1I. In operation, inverter 50 receives a "high" or "low" voltage input corresponding to a logic "1" or logic "0", which is carried by the gate contact 157 to all of the first gates, 159A, 159B, 158B, and 158A respectively. The operation of any of the transistors, $Q_2$, $Q_4$, $Q_3$, or $Q_1$ respectively, is given by the application of this potential to those gates. A potential value is simultaneously applied to the second gates, 164A, 164B, 163A and 163B respectively, of the inverter 50. In one embodiment, transistors $Q_2$ and $Q_1$ are coupled to the gate contact 157 and the potential applied to the second gates 164A and 163A of transistors $Q_2$ and $Q_1$ is the same potential applied to the first gates 159A and 158A of transistors $Q_2$ and $Q_1$. Conduction then occurs between the source/emitter region, 115A or 116A, and the collector/drain region, 115B or 116B, of the responsive transistors.

Applying a potential to the second gates, 164A, 164B, 163A, and 163B, serves primarily to decrease the threshold voltage ($V_t$) for the responsive pair of transistors, $Q_2$ and $Q_4$ or $Q_1$ and $Q_3$. Conversely, the applied potential to the second gates, 164A, 164B, 163A, and 163B, serves primarily to increase the threshold voltage ($V_t$) for the non-responsive pair of transistors, $Q_2$ and $Q_4$ or $Q_1$ and $Q_3$.

In the exemplary embodiment, the second gates 164A and 163A of transistors $Q_2$ and $Q_1$ couple to the gate contact 157 or to the transistor's respective first gates 159A and 158A. Initially, these transistors possess a higher voltage threshold level ($V_t$) than do transistors $Q_4$ and $Q_3$. When off, transistors $Q_2$ and $Q_1$ provide a high impedance in the source/emitter regions 115A and 116A of transistors $Q_4$ and $Q_3$, also termed a "switched source impedance." When the transistor $Q_2$ or $Q_1$ is turned on, its voltage threshold $V_t$ magnitude decreases and they can in fact become depletion mode devices with a large excess in the magnitude of gate voltage over $V_t$. In this state, the transistor $Q_2$ or $Q_1$ has a very low on state resistance. There is only a small degradation in the switching speed of the inverter 50 due to the additional resistance and capacitive load. These circuits do not require extra phase or clock voltages and lines in the cell as synchronous body bias methods and circuits do.

FIG. 2 is a schematic diagram illustrating, by way of example and not by limitation, an inverter array 201 included as part of a logic circuit 200 according to the teachings of the present invention. In FIG. 2 each transistor in the inverter 50 has a selected doping profile to achieve a desired threshold voltage. Each transistor in inverter 50 is either an n-channel metal-oxide semiconductor (NMOS) or a p-channel metal-oxide semiconductor (PMOS). The inverter 50 includes two NMOS transistors, $Q_2$ and $Q_4$ respectively. The NMOS transistors, $Q_2$ and $Q_4$, are coupled to one another. Also, the inverter 50 includes two PMOS transistors, $Q_1$ and $Q_3$ respectively. The PMOS transistors, $Q_1$ and $Q_3$, are likewise coupled to one another. In the exemplary embodiment, NMOS transistors $Q_2$ and $Q_4$ possess different doping profiles such that transistor $Q_2$ has a higher threshold voltage ($V_t$) than transistor $Q_4$. PMOS transistors $Q_1$ and $Q_3$ possess different doping profiles such that transistor $Q_1$ has a higher threshold voltage ($V_t$) than transistor $Q_3$. NMOS transistors, $Q_2$ and $Q_4$, include first gates 259A and 259B respectively. NMOS transistors, $Q_2$ and $Q_4$, include second gates, 264A and 264B respectively. In one embodiment, the NMOS first and second gates, 259A, 259B and 264A, 264B respectively, are formed of n+ silicon material. PMOS transistors, $Q_1$ and $Q_3$, include first gates, 258A and 258B respectively. PMOS transistors, $Q_1$ and $Q_3$, include second gates, 263A and 263B respectively. In one embodiment, the PMOS first and second gates, 258A, 258B and 263A, 263B respectively, are formed of p+ silicon material. The second gates, 264B and 263B, of transistors $Q_4$ and $Q_3$ couple to external potential values. In one embodiment, the second gates 264A and 263A, of transistors $Q_2$ and $Q_1$ couple to the first gates, 259A and 258A, of transistors $Q_2$ and $Q_1$. Inverter 50 also includes a gate contact 257 which couples to all of the fast gates, 259A, 259B, 258A, and 258B respectively, of the NMOS and PMOS transistors to provide an input for inverter 50. Inverter 50 includes an electrical contact 265 which couples to transistors $Q_4$ and $Q_3$ and provides an output to the inverter 50.

In one embodiment, the gate contacts 257 and electrical contacts 265 of selected inverters 50 can be interconnected. The selected interconnection is made through a patterned metallization layer 205 which is coupled to inputs and outputs of selected inverters. The order of interconnection of the inverters will determine the output of logic circuit 200. The metallization layer 205 can be configured to also interconnect other transistors such as to perform basic boolean logic functions such as AND, OR and NOT functions. By order of arrangement, the basic boolean logic functions can be combined such that the combination of these transistors and inverter circuit 200 yields desired logic functions.

Figure 3:
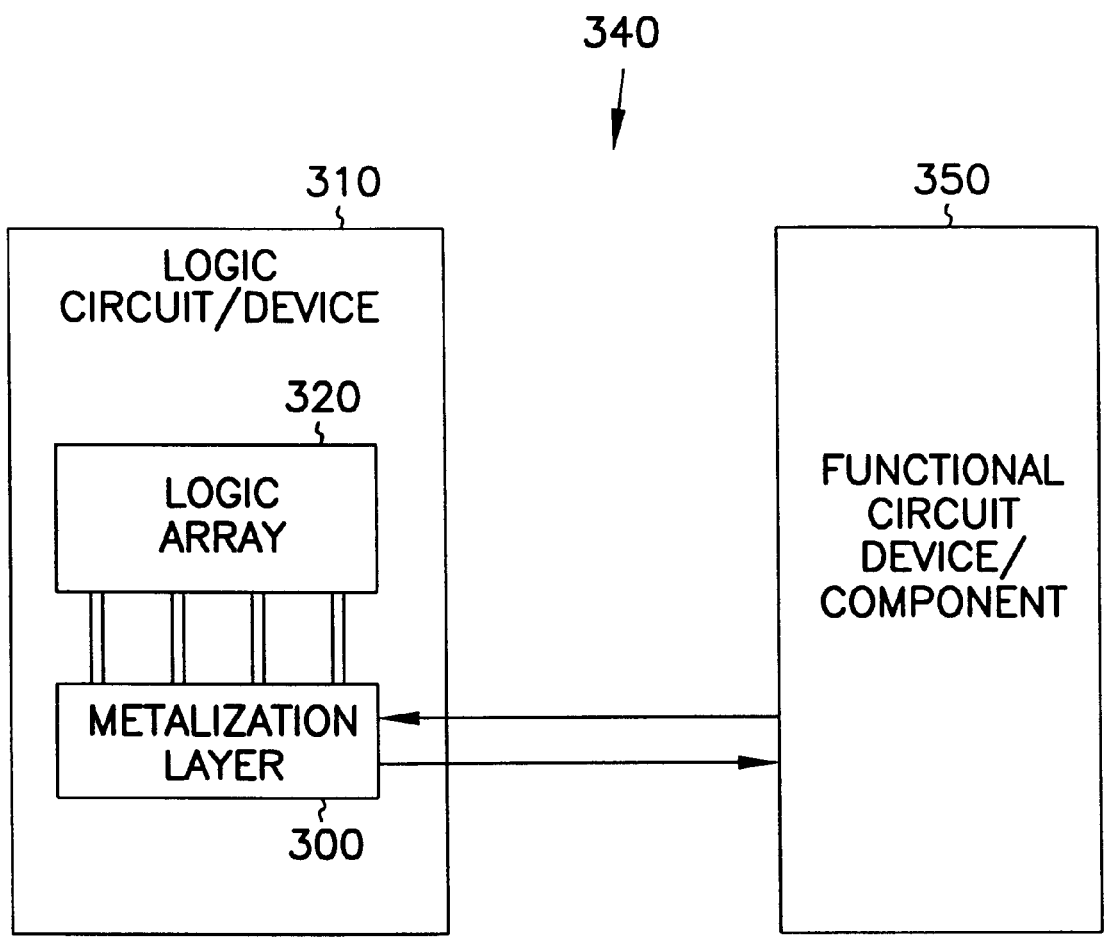
FIG. 3 is a block diagram illustrating a functional circuit according to the teachings of the present invention.

FIG. 3 is a block diagram illustrating a functional circuit 340 according to the teachings of the present invention. FIG. 3 illustrates the use of an inverter in a logic array 320 in a functional circuit 340. The individual inverters within the inverter array 320 are selectively interconnected. The selected interconnection is made through a patternized metallization layer 300 which is coupled to inputs and outputs of selected individual inverters. The selected interconnection of individual inverters in the inverter array 320 with other transistors through the metallization layer 300 forms logic circuit/device 310. The logic circuit/device 310 is electrically interconnected to other functional circuit device/components 350. These other functional circuit devices/components include memory controllers, microprocessors and input/output bus units.

Method of Fabrication for a First and Second Embodiment

Figure 4A:
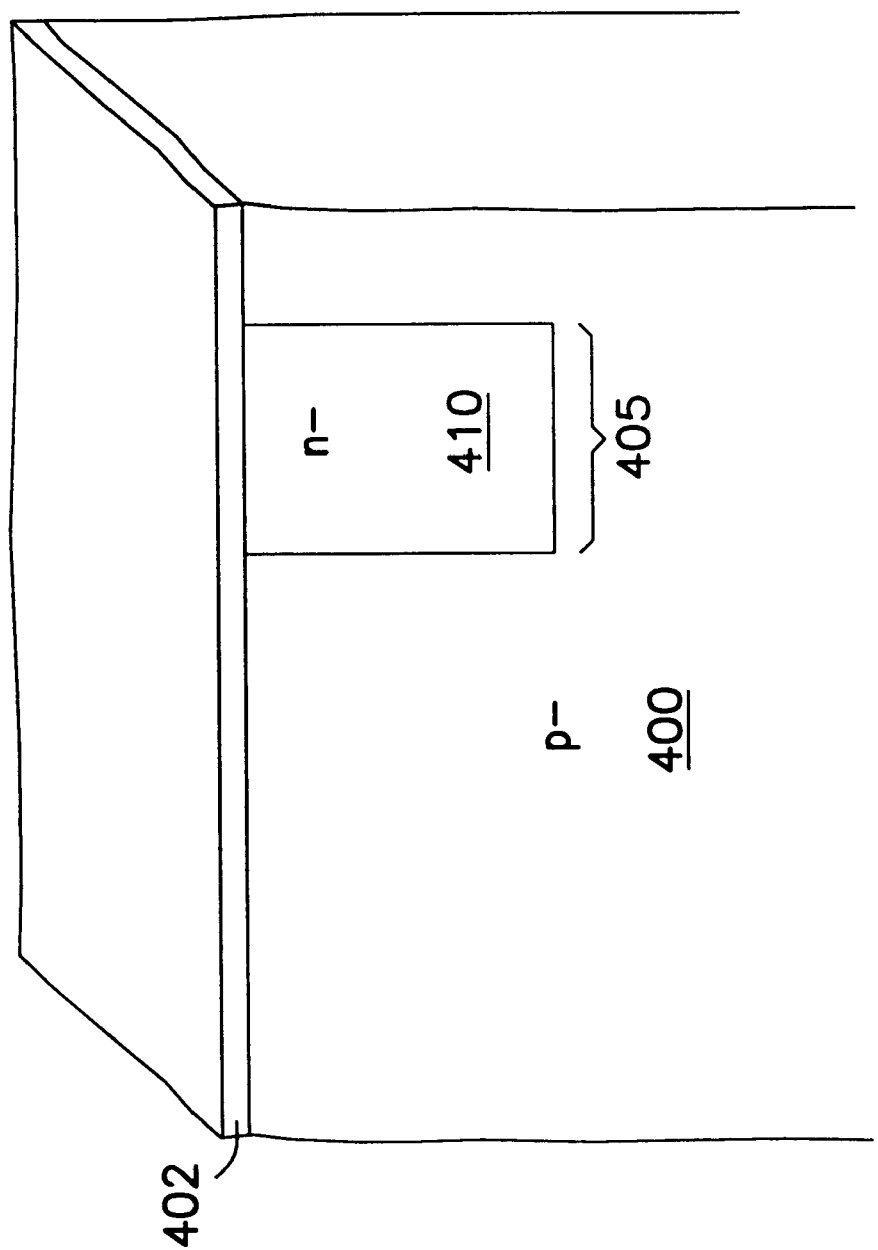
FIGS. 4A–4O illustrate an embodiment of a process of fabrication of an inverter according to the teachings of the present invention.

FIGS. 4A through 4O illustrate an embodiment of the various processing steps for fabricating an inverter formed from a complementary pair of dual-gated transistors. FIG. 4A begins with a lightly doped p– silicon substrate 400. A thin screen oxide layer 402 is thermally grown. The oxide layer 402 is formed to a thickness of approximately 10 nanometers (nm). A photoresist is applied and selectively exposed to reveal p-channel metal-oxide semiconductor (PMOS) device regions 405. Wells of n-type silicon material are formed in the substrate 400 to form the PMOS device regions 405. The n-wells 410 of n-type material can be formed by any suitable method, such as by ion implantation. The n-wells 410 are formed to a depth of approximately 1.0 micrometer ($\mu$m). The photoresist is removed using conventional photoresist stripping techniques. The structure is then annealed, such as by a rapid thermal anneal (RTA) process, to achieve the desired doping profile. The structure is now as it appears in FIG. 4A.

Figure 4B:
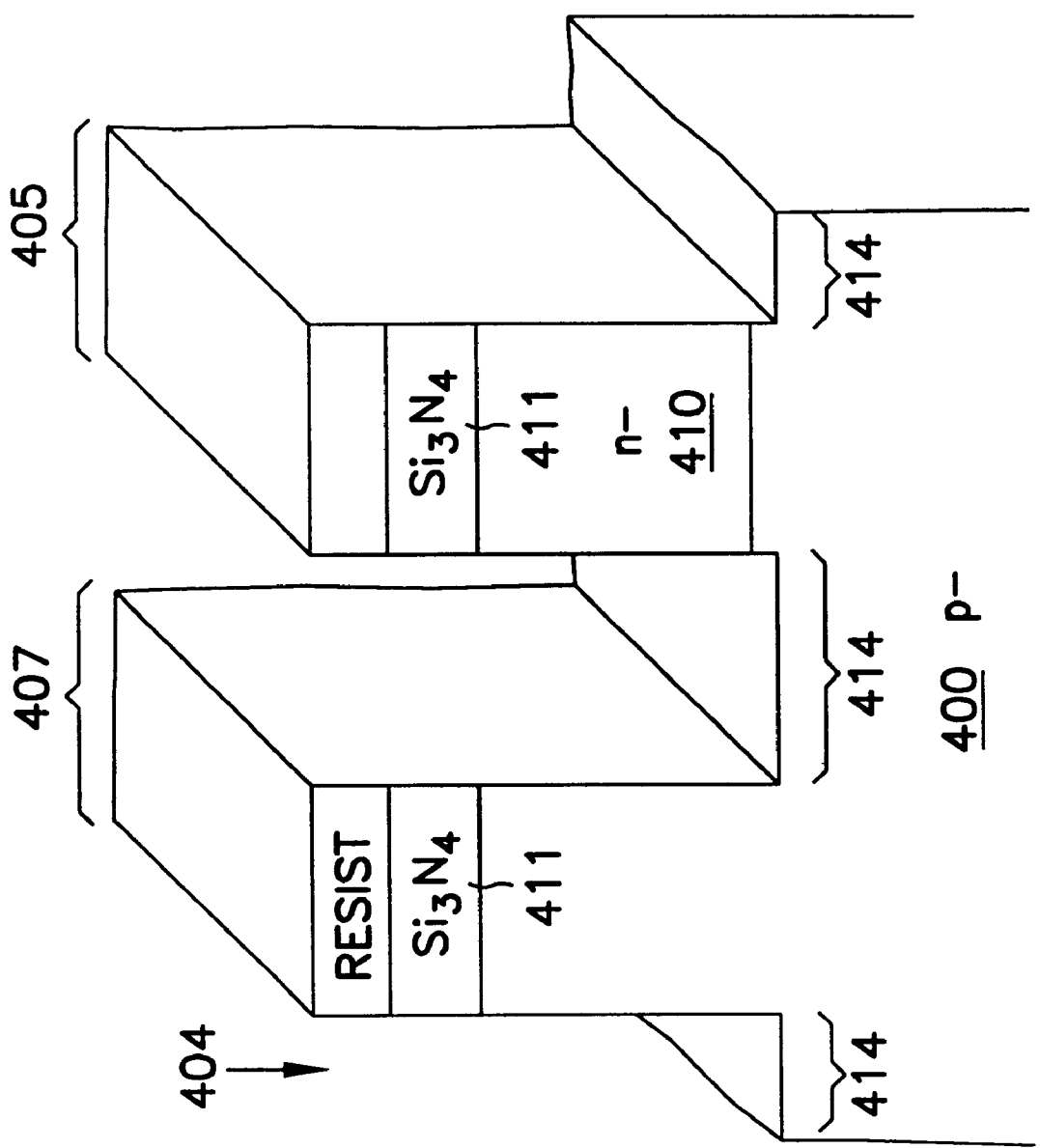

FIG. 4B illustrates the structure after the next sequence of processing steps. A silicon nitride ($Si_3N_4$) pad layer 411 is deposited on the upper surface 404 of the substrate 400 and the n-wells 410. The nitride layer 411 is formed by any suitable means, such as by chemical vapor deposition (CVD). The nitride layer 411 is formed to a thickness of approximately 0.4 $\mu$m. A photoresist is applied and selectively exposed to mask stripes which define active device regions, including both n-channel metal-oxide semiconductor (NMOS) device regions 407 and PMOS device regions 405. The nitride layer 411 in between device regions, 405 and 407, is removed. The nitride layer 411 is removed by any suitable etching technique, such as by RIE. The exposed n-well material 410 and p– substrate material 400 is etched to a depth of approximately 0.2 $\mu$m below the bottom of the n-well 410/substrate 400 interface. These etching steps leave trenches 414 between the device regions 407 and 405. The etching is performed though any suitable process, such as by RIE. The structure is now as shown in FIG. 4B. The photoresist is next stripped, using conventional photoresist stripping techniques.

Figure 4C:
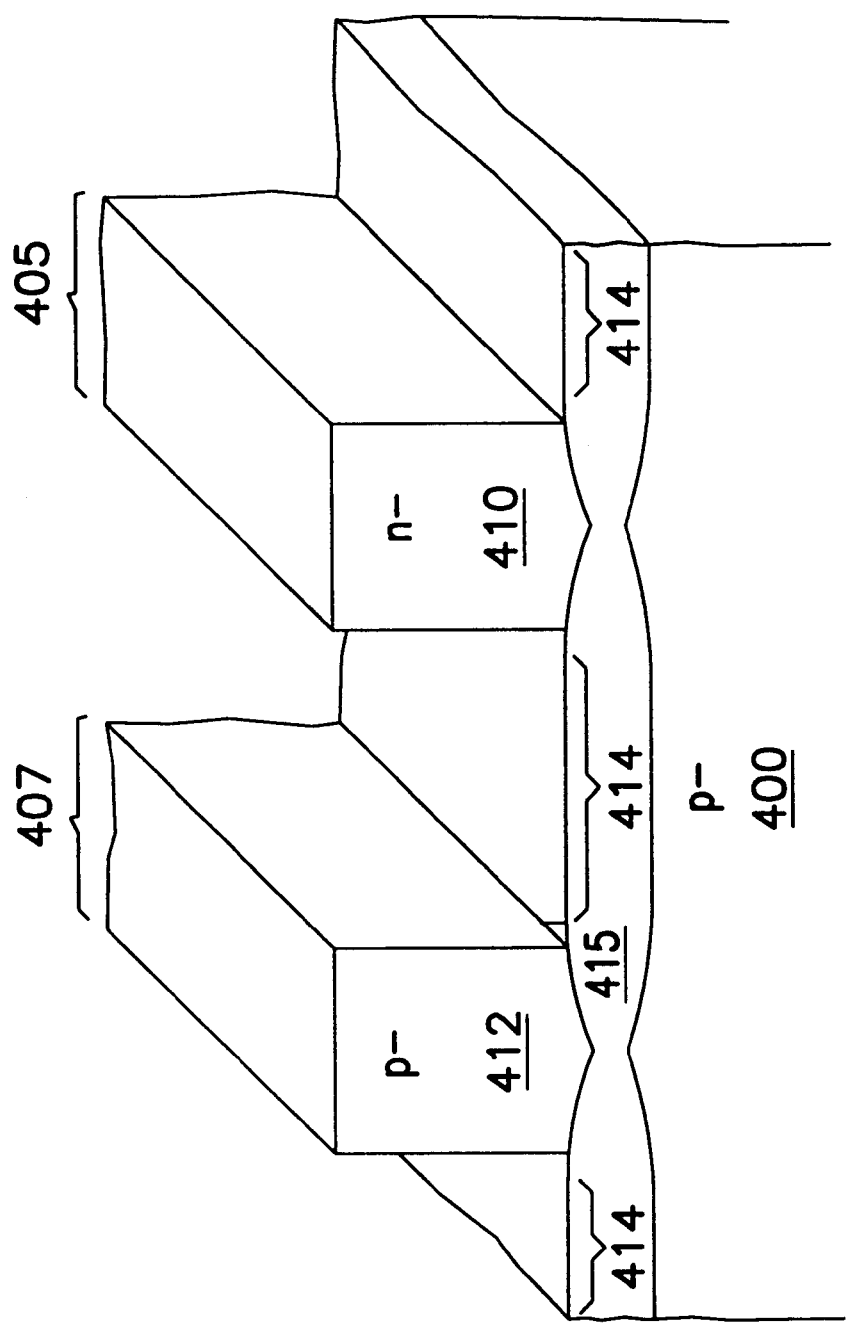

FIG. 4C illustrates the structure after the next series of processing steps. An insulator layer 415 is formed beneath the device regions, 405 and 407 respectively, so as to form a semiconductor on insulator (SOI) structure. The insulator layer 415 is formed using, for example, the techniques of U.S. application Ser. No. 08/745,708, entitled Silicon-On-Insulator Islands and Method for Their Formation (the '708 Application), or U.S. Pat. No. 5,691,230, entitled Technique for Producing Small Islands of Silicon on Insulator (the '230 Patent). The '708 Application and the '230 Patent are incorporated by reference. The insulator layer 415 separates from substrate 400 the p– single crystalline silicon structure 412 of the NMOS device region 407, and the single crystalline silicon structure n-well 410 of the PMOS device region 405. Any of the nitride layer 411 left on the device regions, 405 and 407, is removed by etching. Any suitable etching technique may be used. In one embodiment, the nitride layer is removed by reactive ion etching (RIE). In an alternative embodiment, the nitride layer is removed using a wet etch process. The structure is now as illustrated in FIG. 4C.

Figure 4D:
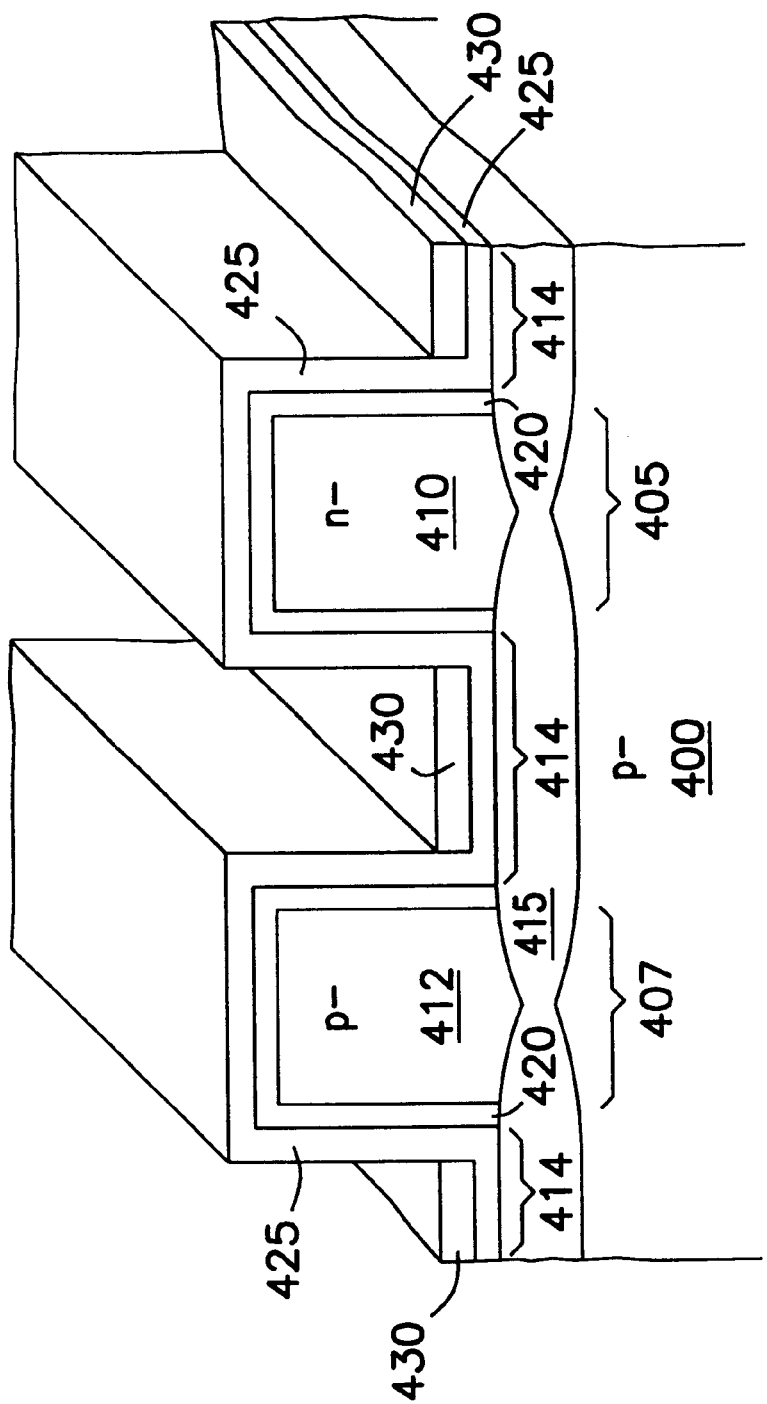

FIG. 4D illustrates the structure following the next series of processing steps. A thin oxide layer 420 is thermally grown on active device regions, 405 and 407. The oxide layer 420 is grown to a thickness of approximately 20 nanometers (nm). A thin silicon nitride ($Si_3N_4$) layer 425 is deposited over the entire surface by CVD. The nitride layer 425 is deposited to a thickness of approximately 50 nm. Intrinsic polysilicon 430 is deposited by any suitable methods, such as by CVD, to fill the trenches 414. Next, the trenches 414 are planarized stopping on the nitride pads 425.

The intrinsic polysilicon 430 in trenches 414 can be planarized by any suitable process, such as by chemical mechanical polishing/planarization (CMP). The intrinsic polysilicon 430 is selectively etched back, such as by RIE, to leave only a thin layer on the bottom of trenches 414. The structure is now as is shown in FIG. 4D.

Figure 4E:
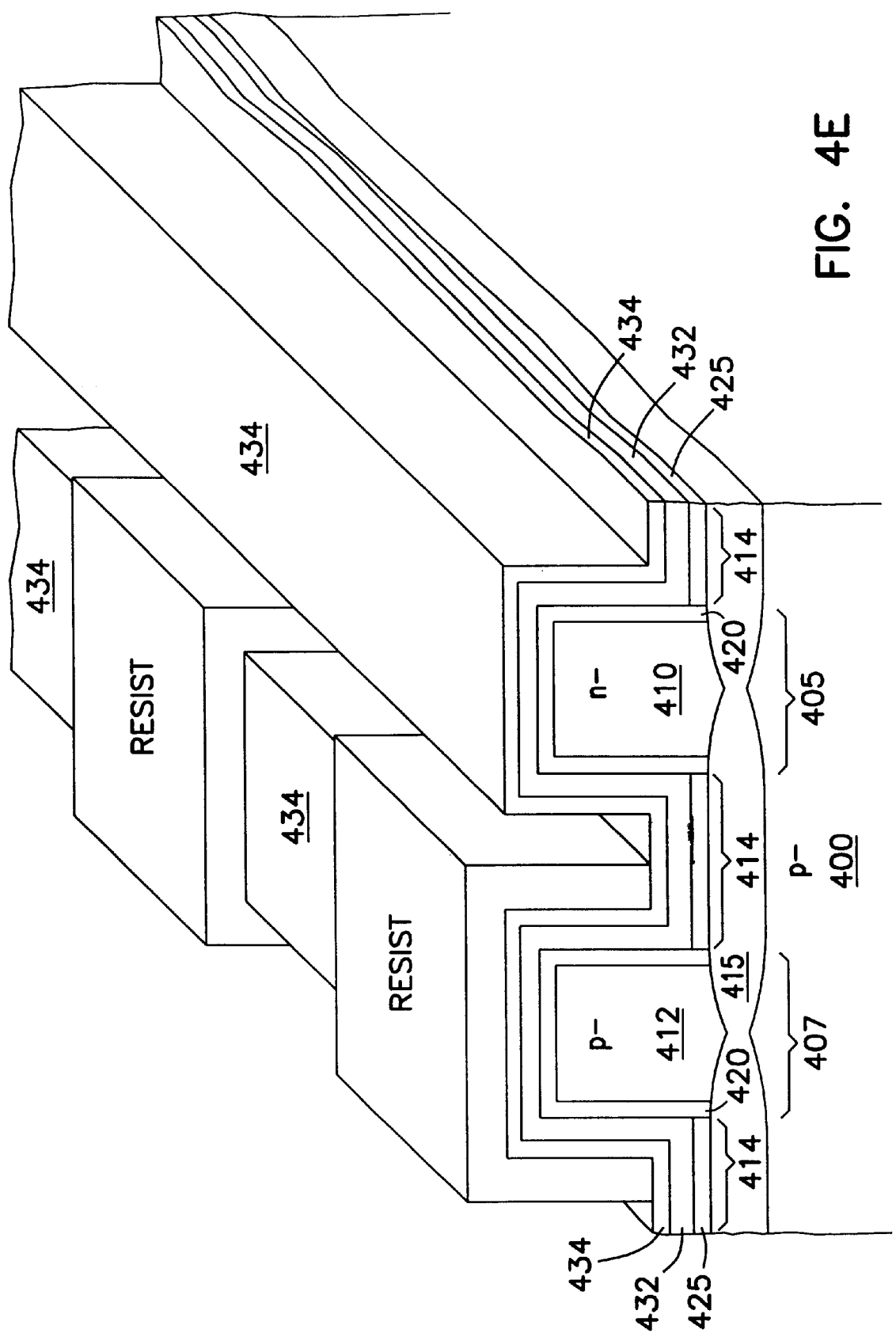

FIG. 4E shows the structure following the next sequence of processing steps. Every exposed portion of the nitride layer 425 is removed by a selective wet etch or RIE, leaving only the nitride 425 covered by the intrinsic polysilicon 430 at the bottom of the trenches 414. The intrinsic polysilicon 430 is then removed by a selective wet etch or RIE. The device regions, 405 and 407 respectively, remain protected by the oxide layer 420. Next, n-doped glass 432 is deposited, such a by CVD. In one embodiment the n-doped glass 432 is Arsenic silicate glass (ASG). In another embodiment, the n-doped glass 432 is Phosphorus silicate glass (PSG). The n-doped glass 432 is deposited to a thickness of approximately 100 nm. A new silicon nitride ($Si_3N_4$) layer 434 is deposited over the n-doped glass 432. The new nitride layer 434 is CVD deposited to a thickness of approximately 20 nm. A photoresist is applied and selectively exposed to reveal PMOS device regions 405 and to pattern the n-doped glass 432 in the NMOS device regions 407 in the form of future source/emitter and collector/drain regions. The structure is now as is shown in FIG. 4E.

Figure 4F:
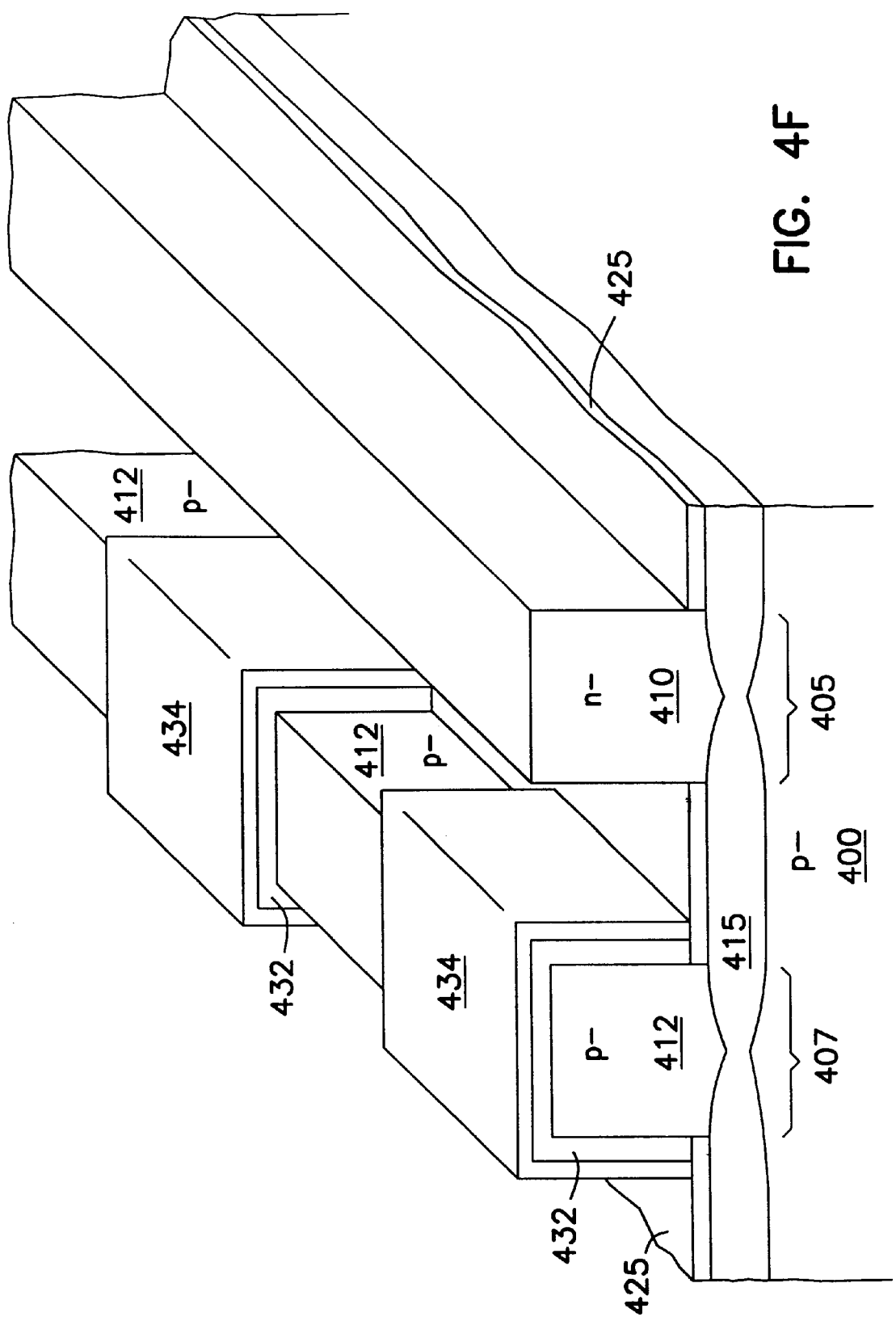

FIG. 4F illustrates the structure following the next series of process steps. The exposed nitride 434 and the underlying n-doped glass 432 are removed by any suitable means, such as by RIE. The nitride located at the bottom of the trenches 414 serves as an etch stop and protects the underlying insulator layer 415. The photoresist is stripped using conventional stripping techniques. A thin nitride layer 434 remains on the patterned n-doped glass 432 which was shielded by the photoresist. The structure is now as is shown in FIG. 4F.

FIG. 4G illustrates the structure following the next sequence of steps. A p-doped glass 436 is deposited by any suitable means such as, for example, CVD. In one embodiment, the p-doped glass 436 is borosilicate glass (BSG). The p-doped glass 436 is deposited to a thickness of approximately 100 nm. Again, a photoresist is applied and exposed to now reveal the NMOS device regions 407 and to pattern the p-doped glass 436 in the PMOS device regions 405 in the form of future source/emitter and collector/drain regions. The structure is now as is shown in FIG. 4G.

Figure 4H:
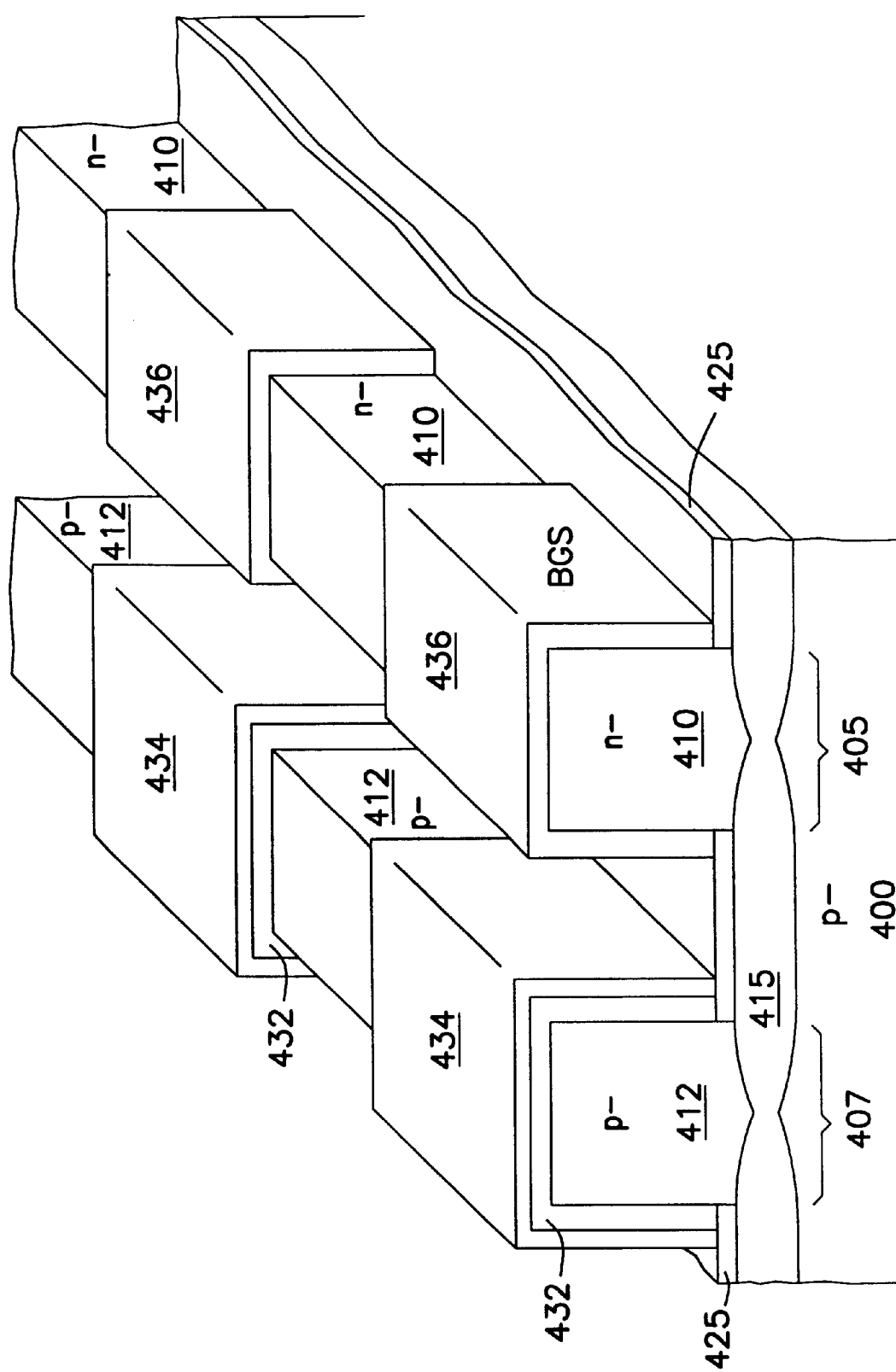
Figure 41:
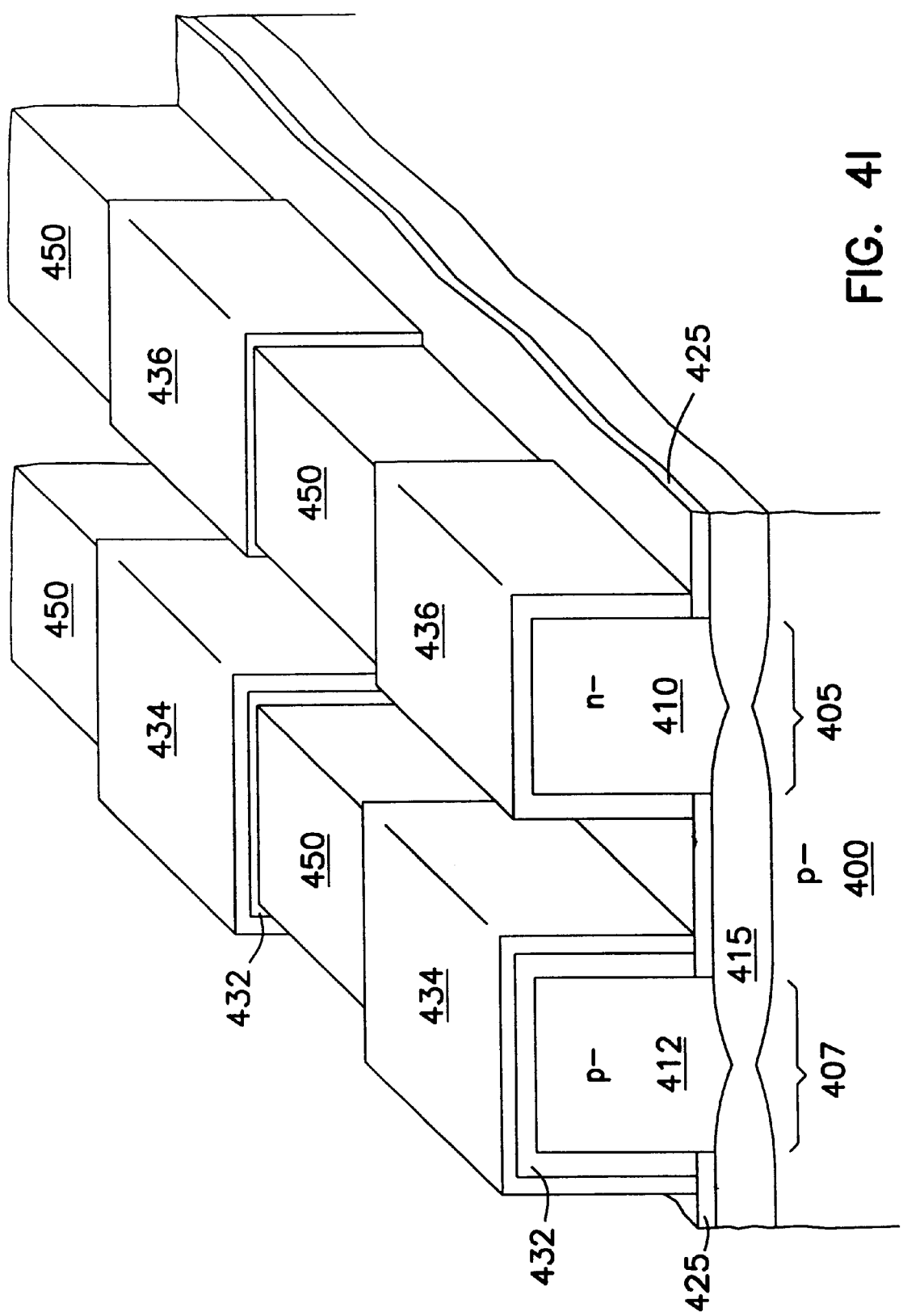

FIG. 4H illustrates the structure following the next series of process steps. The exposed p-doped glass 436 is removed by any suitable means, such as by RIE. The nitride located at the bottom of the trenches 414 again serves as an etch stop and protects the underlying insulator layer 415. Also, the thin nitride layer 434 remaining on patterned n-doped glass 432 portions serves as an etch stop and protects the regions of patterned n-doped glass 432. The photoresist is stripped using conventional stripping techniques. The structure is now as shown in FIG. 4H.

FIG. 4I provides a perspective view of the structure after the next process step. In this step a gate oxide 450 is thermally grown on the p– single crystalline silicon structure 412 of the NMOS device region 407, and on the n-well single crystalline silicon structure 410 of the PMOS device region 405.

Figure 4J:
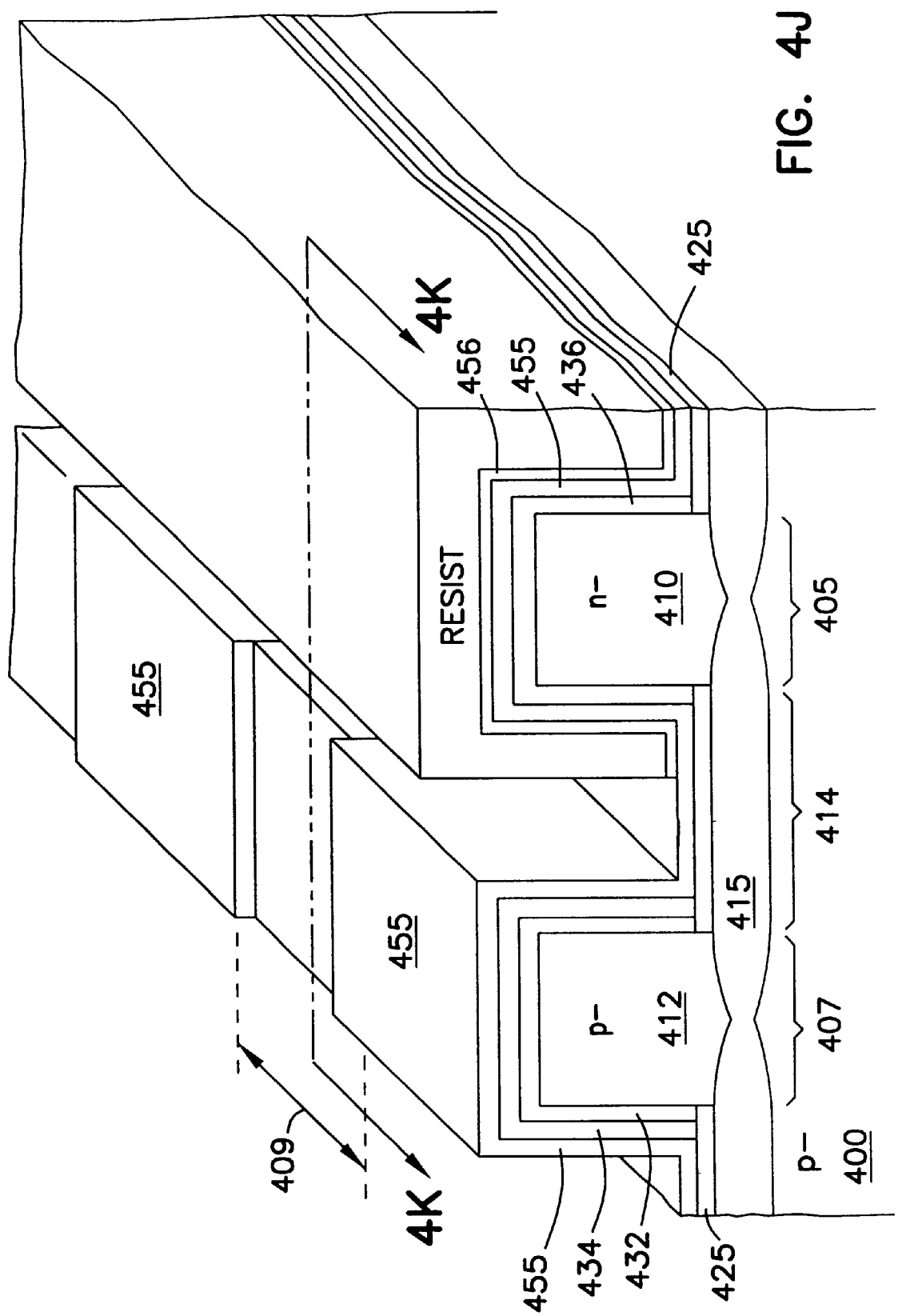

FIG. 4J carries the sequence of process steps further. In FIG. 4J, a thin intrinsic polysilicon layer 455 is deposited, such as by CVD. The intrinsic polysilicon layer 455 is formed to a thickness of approximately 50 nm. Next, a thin oxide layer 456 is deposited across the nitride layer 455. The oxide layer 456 can be deposited by any suitable method, such as by CVD. The oxide layer is deposited to a thickness of approximately 10 nm. A photoresist is applied and masked to expose the NMOS device region 407. The exposed oxide layer 456 is etched back. The etching is performed by any suitable method and can be accomplished using reactive ion etching (RIE). The structure is now as appears in FIG. 4J.

Figure 4K:
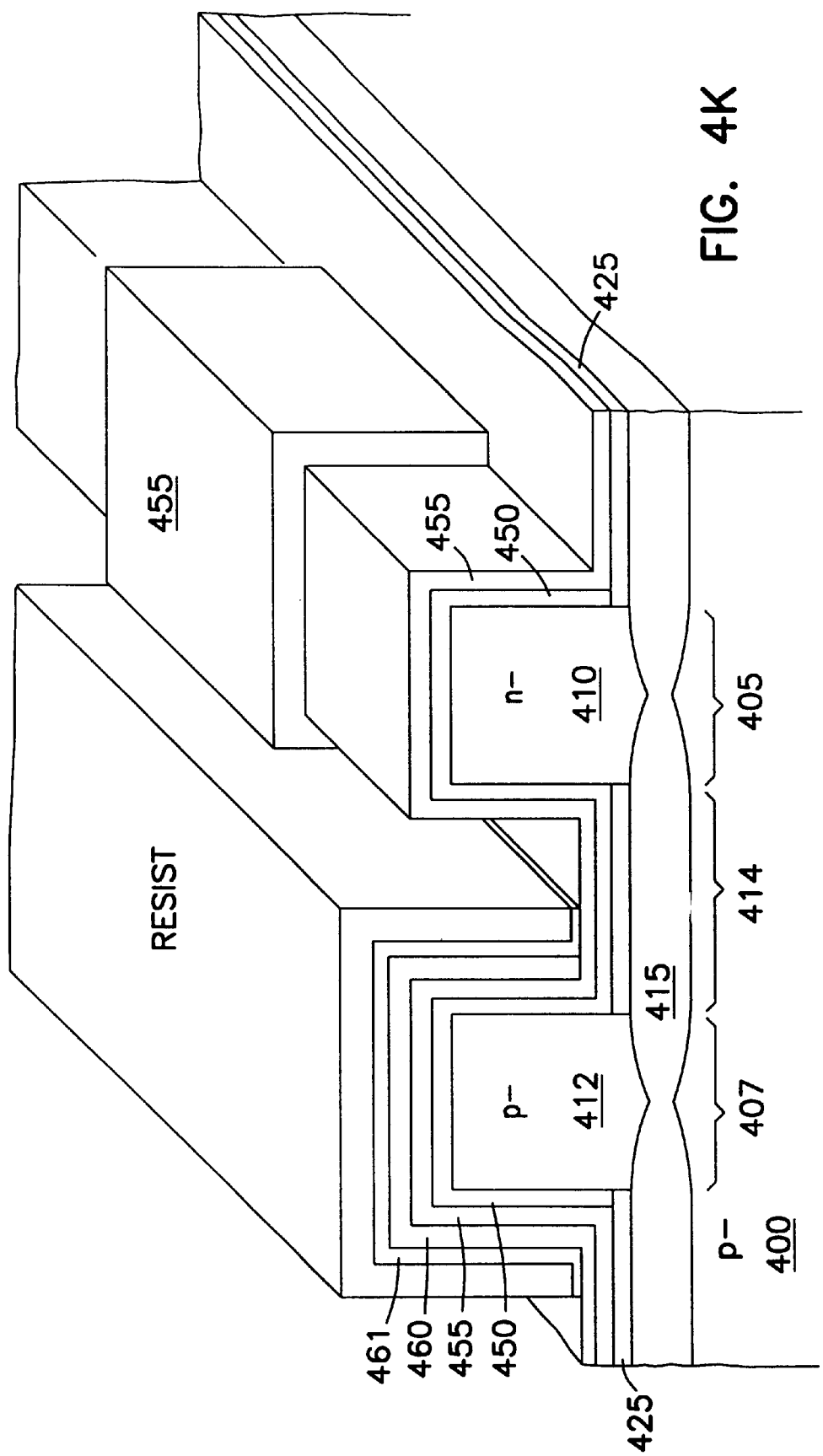

FIG. 4K illustrates the structure following the next sequence of process steps. FIG. 4K is a cross-sectional view of the gate region 409 taken along cut line 4K—4K The photoresist has been stripped using conventional photoresist stripping techniques. Now, an n+ polysilicon layer 460 is deposited across the entire surface. The n+ polysilicon layer is deposited by any suitable means, such as by CVD. Next, a nitride layer 461 is deposited across the entire surface, such as by CVD. The nitride layer is deposited to a thickness of approximately 20 nm. A photoresist is applied and selectively exposed to reveal the PMOS device regions 405. The exposed nitride layer 461 and n+ polysilicon layer 460 underneath are etched off, such as by RIE. The exposed oxide layer 456 is next etched away by RIE. The structure is now as appears in FIG. 4K.

Figure 4L:
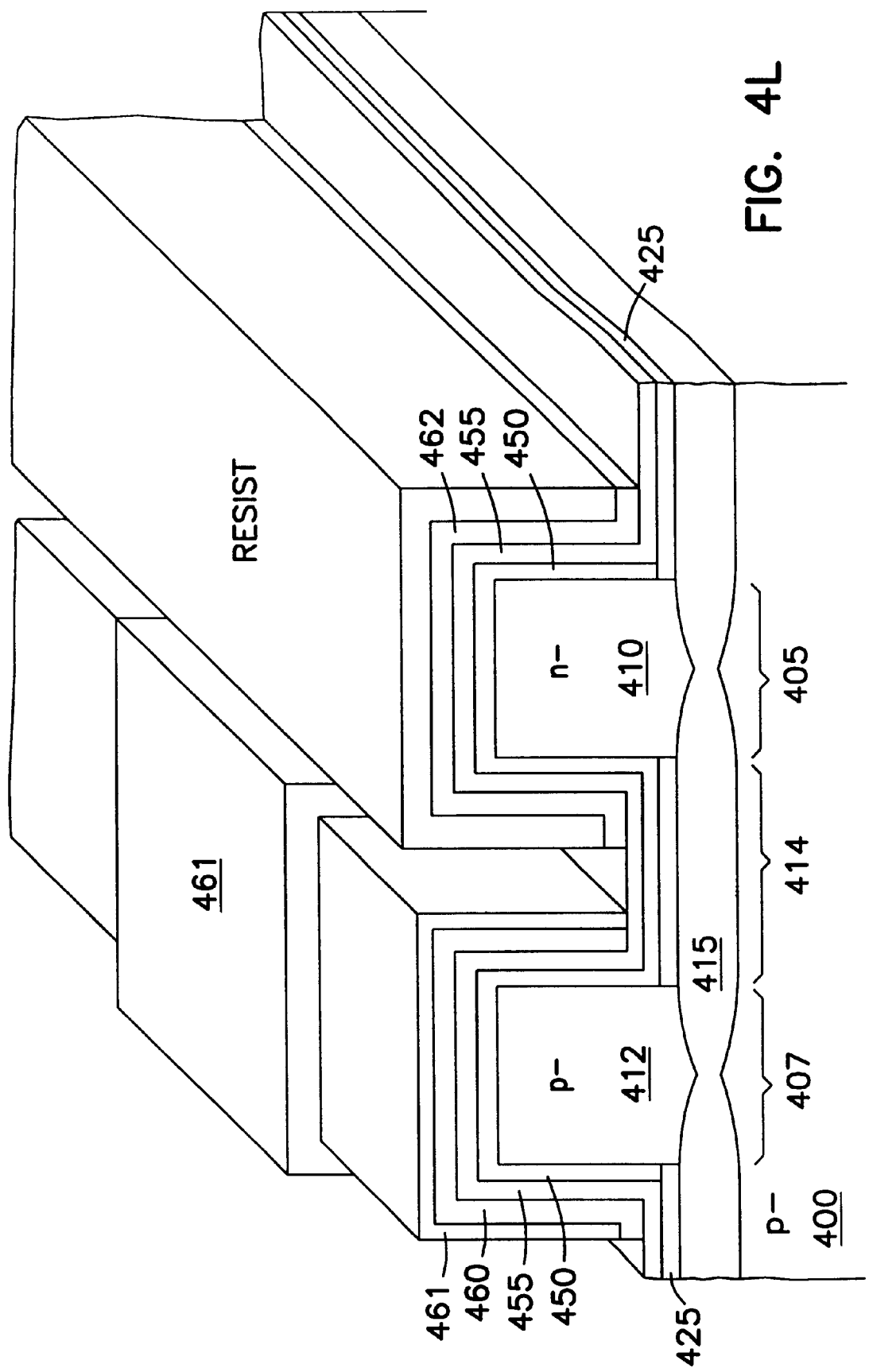

FIG. 4L illustrates the structure following the next sequence of process steps. The photoresist has been stripped using conventional photoresist stripping techniques. Now, a p+ polysilicon layer 462 is deposited across the entire surface. The p+ polysilicon layer is deposited by any suitable means, such as by CVD. A photoresist is applied and selectively exposed to reveal the NMOS device regions 407. The exposed p+ polysilicon layer 462 is etched off, such as by RIE. The structure is now as appears in FIG. 4L.

Figure 4M:
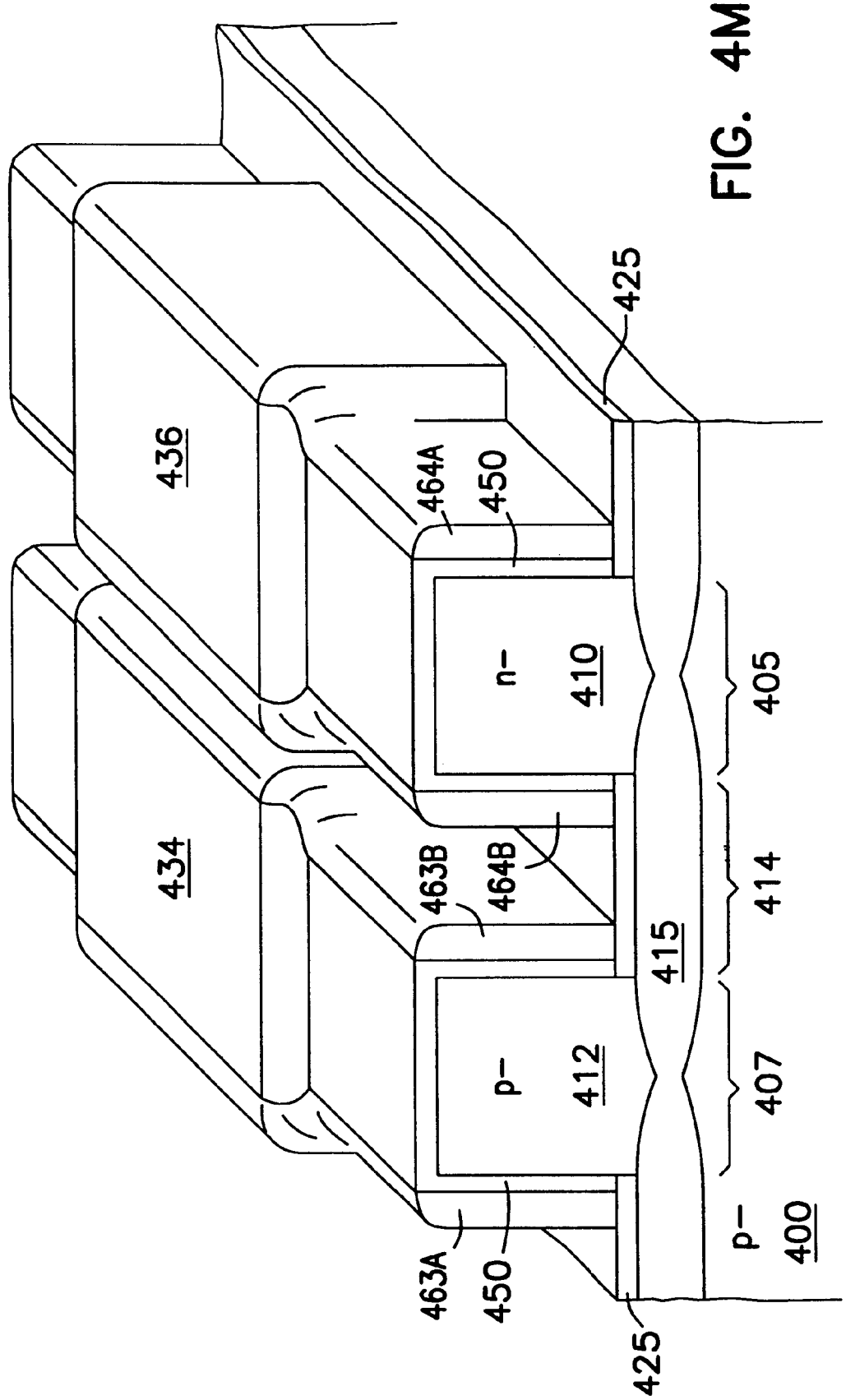

FIG. 4M illustrates the structure after the next group of process steps. The photoresist is stripped using conventional photoresist stripping techniques. The structure undergoes an anneal, such as a rapid thermal anneal (RTA), in order to drive the dopant species from the heavily doped n+ and p+ polysilicon layer, 460 and 462 respectively, into the underlying, undoped polysilicon 455. This step forms a heavily doped n+ gate layer 463 in the NMOS device region 407, and forms a heavily doped p+ silicon gate layer 464 in the PMOS device region 405. The anneal also serves to drive the dopant into the n-well single crystalline silicon structure 410 and the p– single crystalline silicon structure 412 from the p-doped glass 436 and the n-doped glass 432 respectively. The n+ and p+ polysilicon gate layers, 463 and 464 respectively, are directionally etched to leave only on the vertical side walls of the NMOS and PMOS device regions, 407 and 405. This step forms heavily doped first and second n+ gates, 463A and 463B, in the NMOS device region 407, and forms heavily doped p+ silicon gates, 464A and 464B, in the PMOS device region 405. The structure is then as appears in FIG. 4M.

Figure 4N:
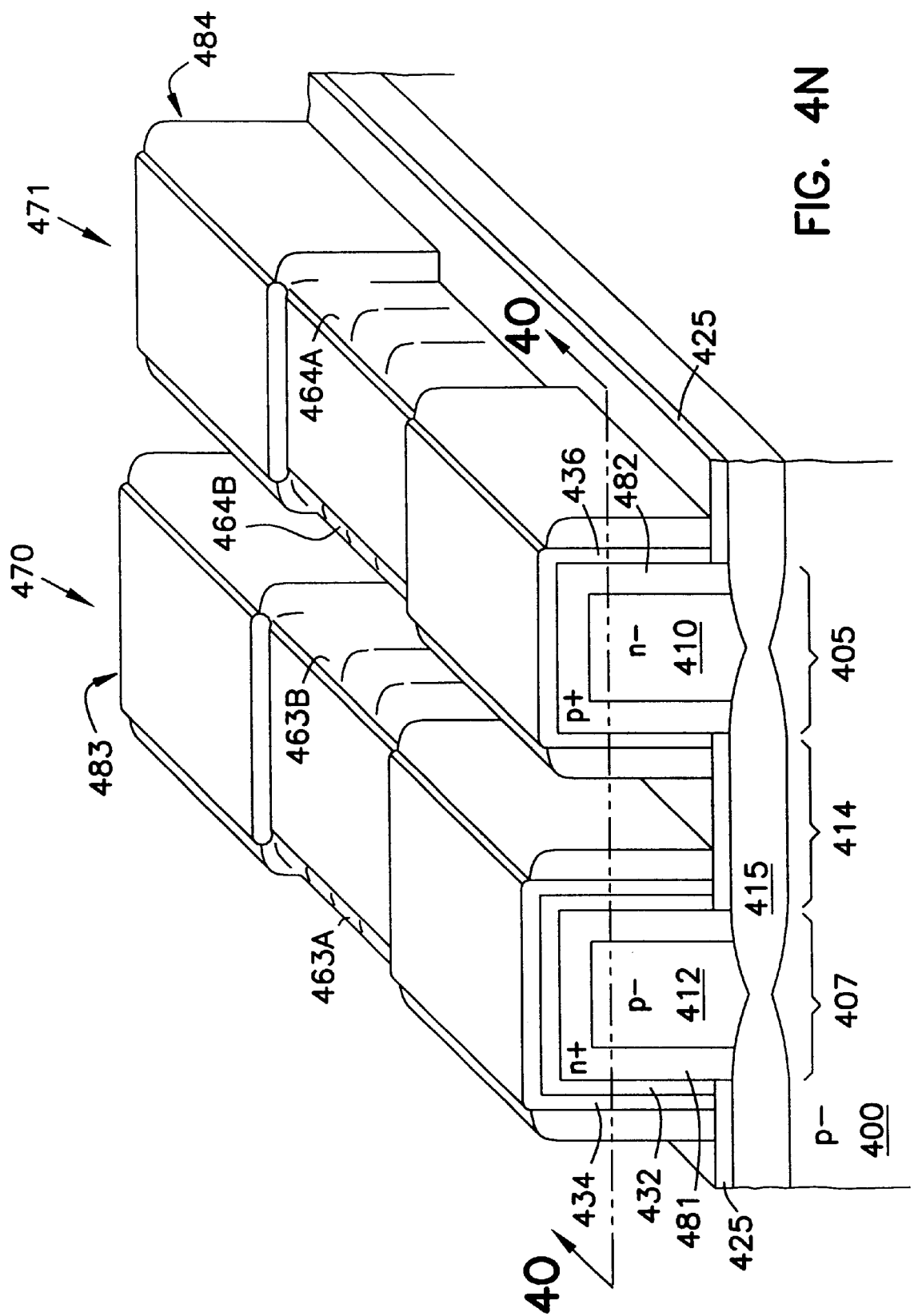

FIG. 4N provides a broader perspective view following the preceding series of process steps. FIG. 4N illustrates full length NMOS and PMOS devices, 470 and 471 respectively. FIG. 4N illustrates the location of the newly formed source/emitter regions, 481 and 482, as well as the collector/drain regions, 483 and 484, for the NMOS and PMOS devices, 470 and 471. FIG. 4O is a top view of FIG. 4N taken along cut line 4N—4N.

Finally, in a final sequence of processing steps, and following conventional method, a photoresist is applied and masked to expose any vertical walls where polysilicon 463 or 464 is to be removed to terminate gate lines. Such polysilicon 463 or 464 is then etched back by any suitable method, such as by RIE. The photoresist is stripped using conventional photoresist stripping techniques. An oxide or other insulator is deposited and planarized to fill the trenches 414 between the NMOS and PMOS devices, 470 and 471 respectively. The insulator deposition is performed by any suitable method, such as by CVD. The planarization is also achieved by any suitable technique, such as by CMP.

Contact holes and wiring for both the gate contact and the electrical contact are achieved through conventional processing steps. One skilled in the art will recognize the method to these steps and, hence, they are not disclosed as part of this application.

Second Inverter Embodiment

Figure 5A:
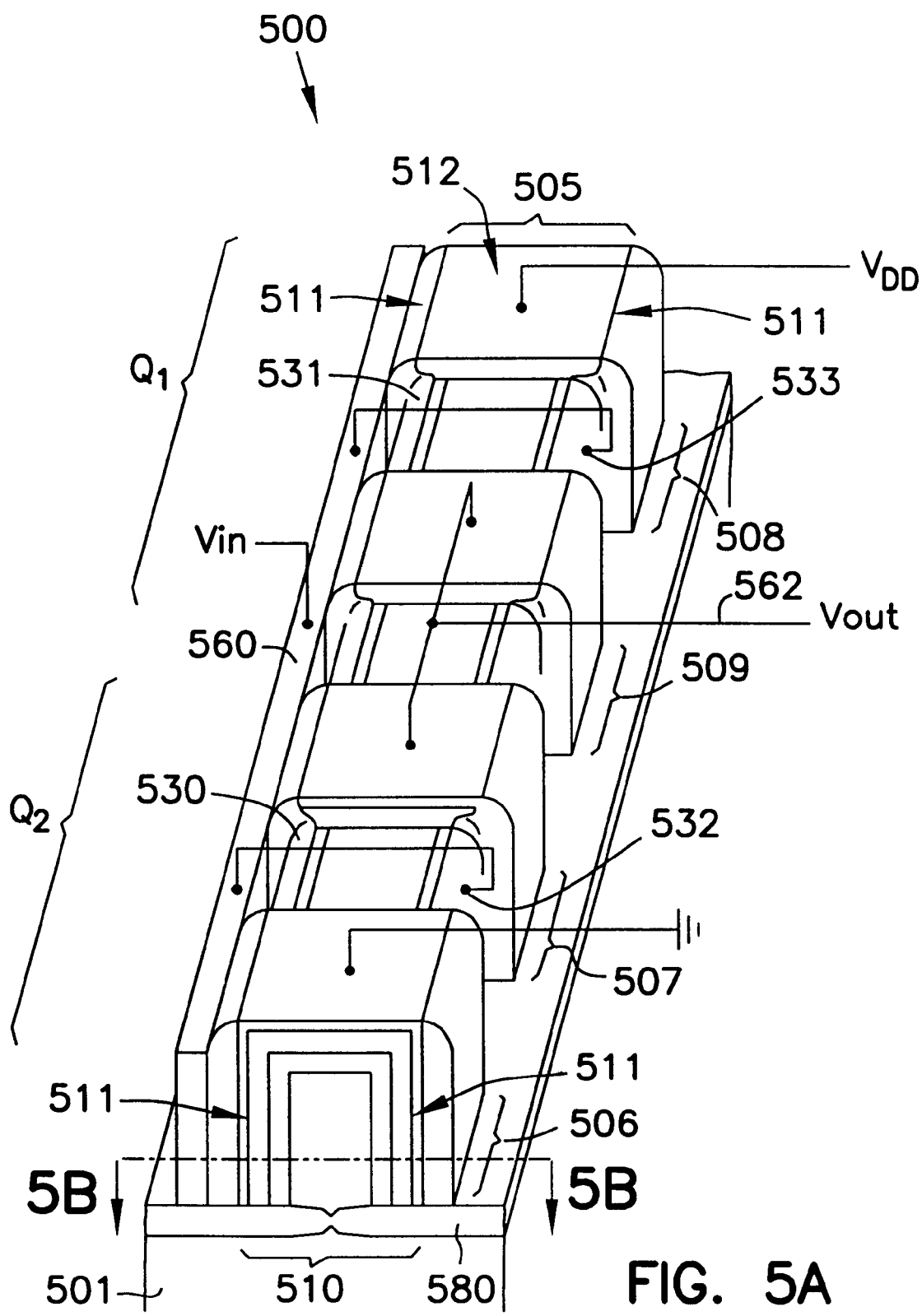
FIG. 5A is a perspective view illustrating a second embodiment of an inverter according to the teachings of the present invention.

FIG. 5A is a perspective view illustrating generally an embodiment of a portion of an inverter according to the teachings of the present-invention. Specifically, inverter 500 is a two transistor device that is formed using, for example, the technique described above with respect to FIGS. 4A through 4P. The inverter is formed from a complementary pair of gate body transistors. The complementary pair includes a first channel type transistor and a second channel type transistor. Each transistor in inverter 500 is either an n-channel metal-oxide semiconductor (NMOS) or a p-channel metal-oxide semiconductor (PMOS). The inverter 500 includes one NMOS transistor $Q_2$ and one PMOS transistor $Q_1$. Each NMOS and PMOS transistor includes a body region, 510 and 505 respectively, formed of single crystalline semiconductor material that extends outwardly from a substrate. The body regions 510 and 505 have an upper surface 512 and opposing sidewalls 511. In one embodiment, the NMOS body region 510 is formed of p– silicon material and the PMOS body region 505 is formed of n– silicon material. The substrate 501 is p– silicon material. In an exemplary embodiment, the NMOS and PMOS body regions, 510 and 505 respectively, are formed on an insulator layer 580 formed on the substrate 501. The NMOS and PMOS transistors include source/emitter regions, 506 and 508 respectively, formed within the upper surface 512 and opposing sidewall surfaces 511 of the body regions, 510 and 505 respectively. Likewise, each of the NMOS and PMOS transistors include a collector/drain region, 507 and 509 respectively, formed within the upper surface 512 and opposing sidewall surfaces 511 of the body regions, 510 and 505 respectively. First gates, 530 and 531, are formed on a gate oxide 529 on a first one of the opposing sidewalls for each of the NMOS and PMOS transistors. An electrical contact 562 couples between collector/drain regions, 507 and 509, of the complementary pair to provide an output for the inverter 500. A gate contact 560 interconnects the first gates, 530 and 531, of the complementary pair and serves as an input to the inverter. The inverter 500 includes second gates, 532 and 533, formed on a gate oxide 529 on a second one of the opposing sidewalls for each of the NMOS and PMOS transistors. In one embodiment, the first gates, 530 and 531, couple to the second gates, 532 and 533, in the NMOS and PMOS transistors. The first and second gates, 530 and 532, of the NMOS transistor are formed of n+ silicon material. The first and second gates, 531 and 533, of the PMOS transistor are formed of p+ silicon material.

Figure 5B:
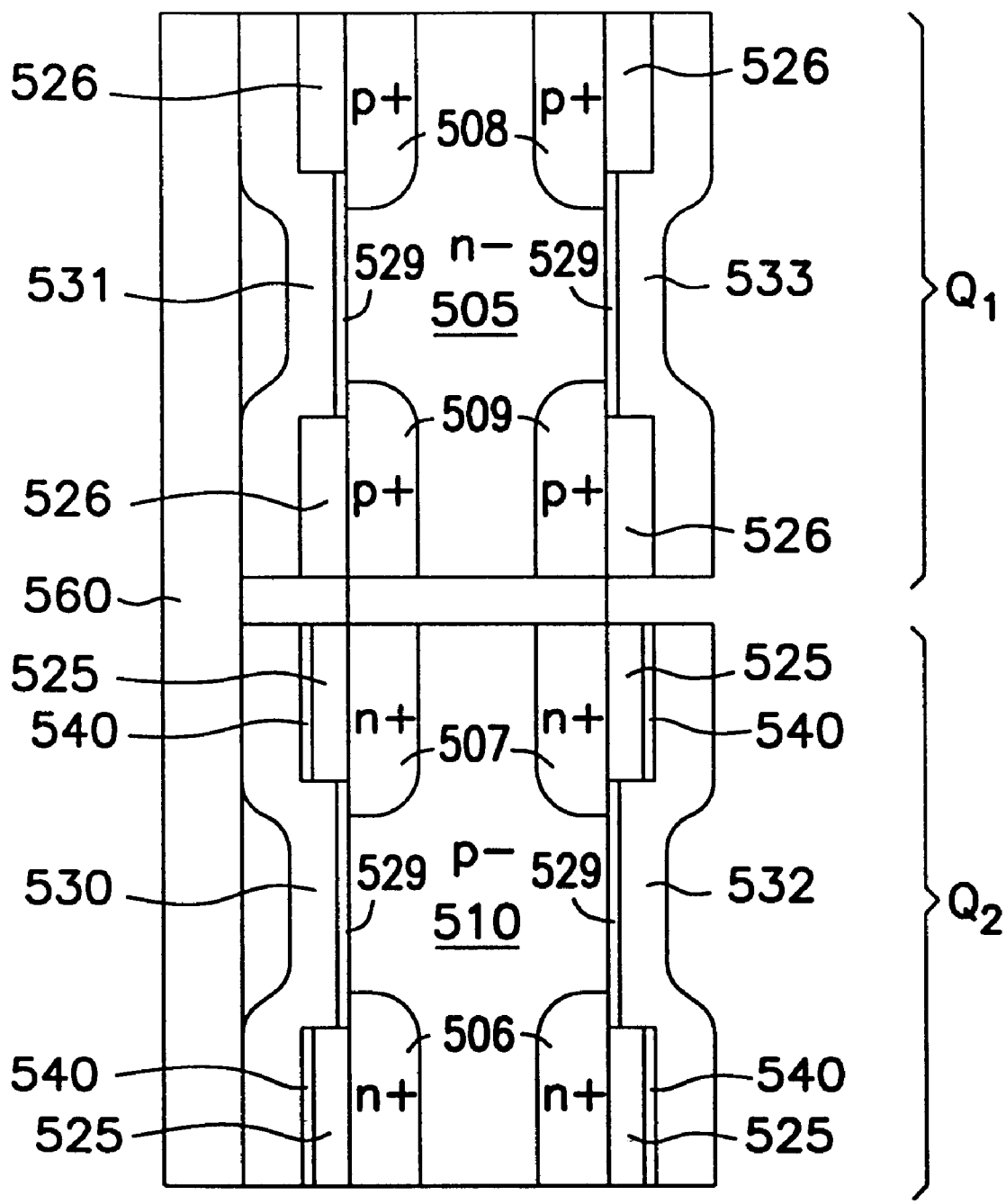
FIG. 5B is a cross-sectional view taken along cut line 5B—5B of FIG. 5A.

FIG. 5B is a cross-sectional view taken along cut line 5B—5B of FIG. 5A. FIG. 5B illustrates the NMOS and the PMOS transistors, $Q_2$ and $Q_1$, coupled together via gate contact 560. FIG. 5B illustrates more clearly the first gates, 530 and 531 respectively, of transistors, $Q_2$ and $Q_1$, coupled to the gate oxide 529 on one of the opposing sidewall surfaces 511. FIG. 5B shows that the first gates, 530 and 531 respectively, of transistors $Q_2$ and $Q_1$ are separated from coupling to the source/emitter regions, 506 and 508, and the collector/drain regions, 507 and 509, by doped glass layers 525 and 526. In the case of transistor $Q_2$, the first gate 530 is additionally separated from coupling to the source/emitter region 506 and the collector/drain region 507 by a nitride layer 540. Similarly, FIG. 5B illustrates more clearly the second gates, 532 and 533 respectively, of transistors $Q_2$ and $Q_1$, coupled to the gate oxides 529 on the other of the opposing sidewall surfaces 511. FIG. 5B shows that the second gates, 532 and 533 respectively, of transistors $Q_2$ and $Q_1$ are also separated from coupling to the source/emitter regions, 506 and 508, and the collector/drain regions, 507 and 509, by doped glass layers 525 and 526. In the case of transistor $Q_2$, the second gate 532 is additionally separated from coupling to the source/emitter region 506 and the collector/drain region 507 by a nitride layer 540.

Figure 5C:
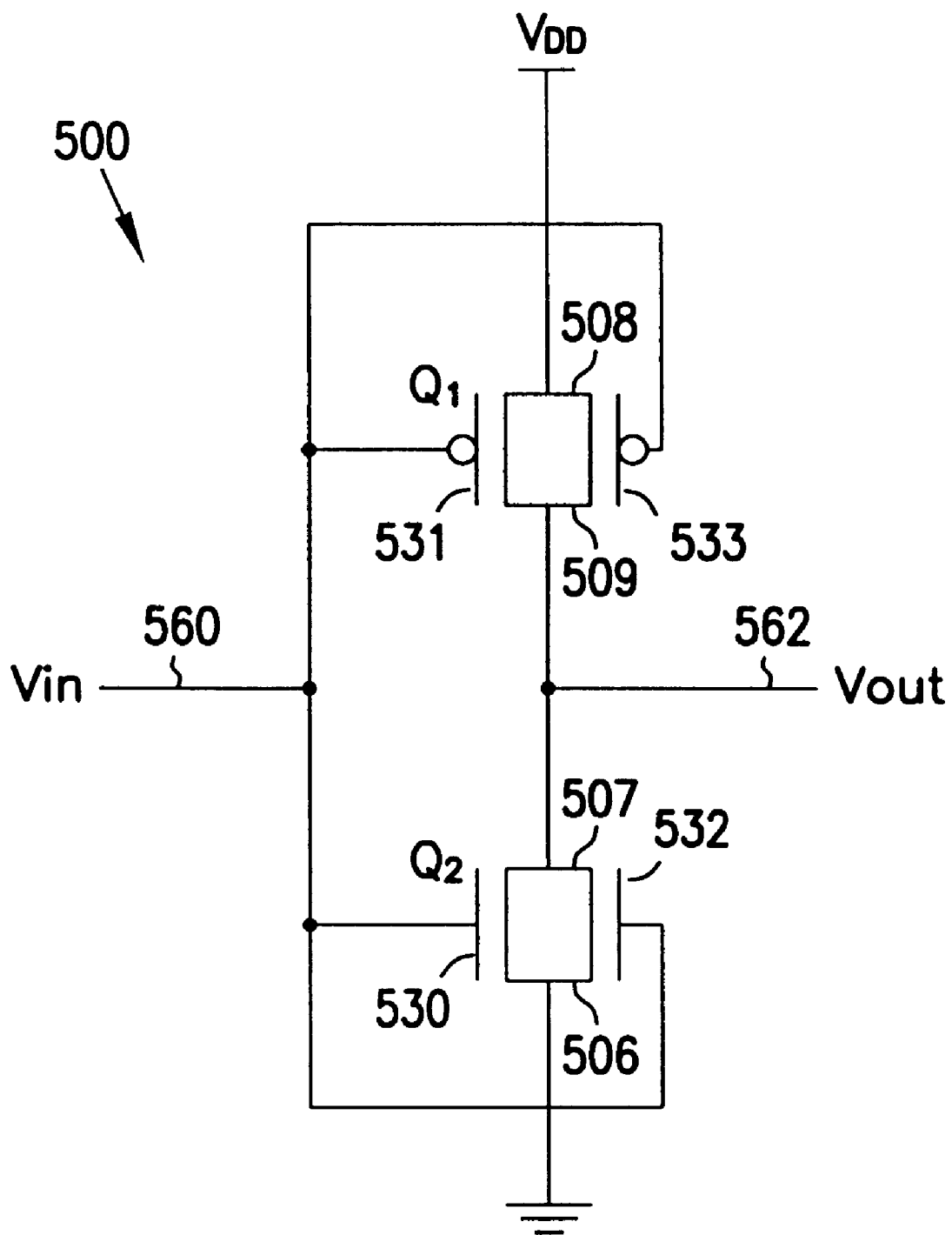
FIG. 5C is a schematic diagram illustrating an embodiment of the inverter of FIG. 5A.

FIG. 5C is a schematic diagram of the inverter shown in FIG. 5A. The operation of the embodiment of FIG. 5A is described in connection with the schematic diagram of FIG. 5C. In operation, inverter 500 receives a "high" or "low" voltage input corresponding to a logic "1" or logic "0". The voltage input is coupled to the gate contact 560. The input on the gate contact 560 is simultaneously coupled to the first gates, 530 and 531. A potential is similarly applied to the second gates, 532 and 533. This action, in effect, reduces the voltage threshold level ($V_t$) for turning on the responsive transistor and results in quicker activation or switching speed for the "triggered" transistor. In one embodiment, the input on the gate contact 560 is coupled to both the first gates, 530 and 531, and to the second gates, 532 and 533.

Conduction in either the NMOS or PMOS transistors couples the source/emitter region, 506 or 508, and the collector/drain region, 507 or 509, within the same transistor. The source/emitter regions, 506 and 508, of the NMOS and PMOS transistors are both electrically connected to external potential levels. The potential level connected to the conducting transistor is carried to the associated collector/drain region, 507 or 509, and to the electrical contact 562 which serves as the output to the inverter.

Figure 6:
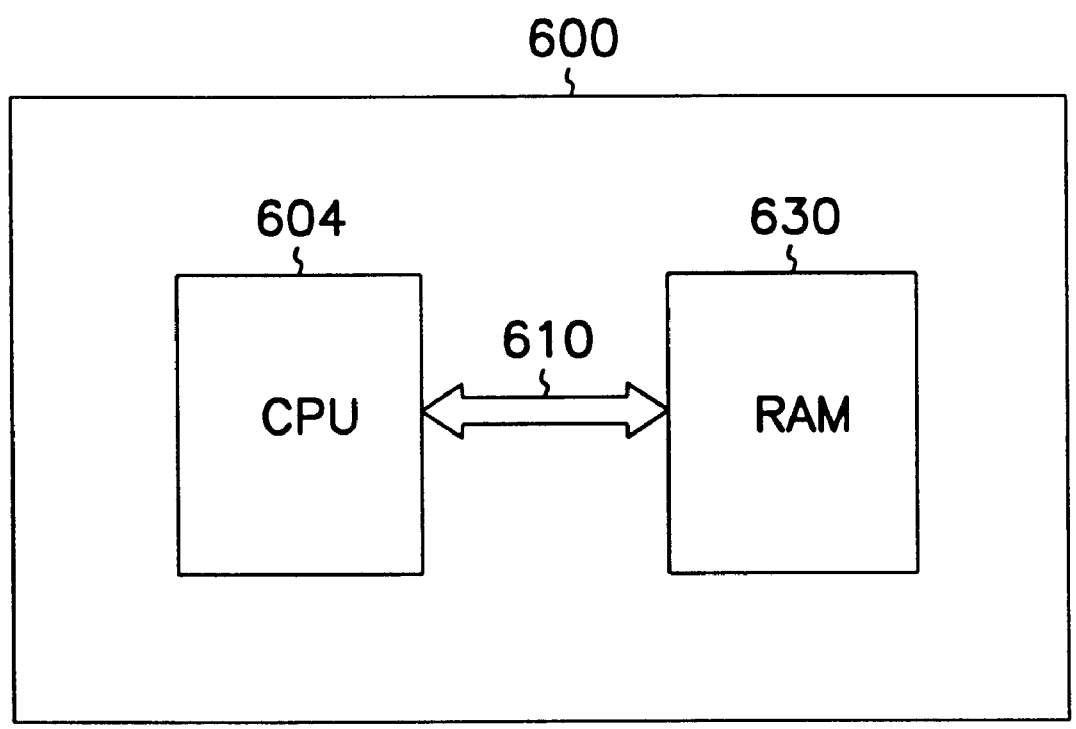
FIG. 6 is a block diagram illustrating an information handling system according to an embodiment of the present invention.

FIG. 6 is a block diagram illustrating an information handling system 600 according to an embodiment of the present invention. The information handling system includes a central processing unit 604. The central processing 604 unit is coupled to a random access memory (RAM) 630 by a system bus 610. The central processing unit can be constructed to include either of the inverter structure embodiments presented above.

Conclusion

Circuits and methods for improved inverters are provided. Arrays of these inverters can be further combined with a metallization layer to form a logic circuit and to external components to form a functional circuit. The present invention provides for enhanced switching operation, prevents subthreshold leakage current at standby and conserves surface space on the surface of the chip. These devices can be used in a variety of applications, digital and analog, wherever a more compact structure with low power consumption and fast response time is needed.

It is to be understood that the above description is intended to be illustrative, and not restrictive. Combinations of the above embodiments, and other embodiments will be apparent to those of skill in the art upon reviewing the above description. The above structures and fabrication methods have been described, by way of example, and not by way of limitation, with respect to the transistors and inverters. However, the scope of the invention includes any other integrated circuit applications in which the above structures and fabrication methods are used. Thus, the scope of the invention is not limited to the particular embodiments shown and described herein. The scope of the invention should be determined with reference to the appended claims, along with the full scope of equivalents to which such claims are entitled.

What is claimed is:

1. An inverter, comprising:

a first transistor, the first transistor having a source region, a drain region, a pair of opposing sidewall surfaces, a first gate on a first one of the opposing sidewall surfaces, and a second gate on a second one of the opposing sidewall surfaces;

a second transistor, the second transistor having a source region a drain region, a pair of opposing sidewall surfaces, a first gate on a first one of the opposing sidewall surfaces, and a second gate on a second one of the opposing sidewall surfaces, the source region of the second transistor being electrically connected to the drain region of the first transistor;

a third transistor, the third transistor having a source region, a drain region, a pair of opposing sidewall surfaces, a first gate on a first one of the opposing sidewall surfaces, and a second gate on a second one of the opposing sidewall surfaces;

a fourth transistor, the fourth transistor having a source region, a drain region, a pair of opposing sidewall surfaces, a first gate on a first one of the opposing sidewall surfaces, and a second gate on a second one of the opposing sidewall surfaces, the drain region of the fourth transistor being electrically connected to the source region of the third transistor;

the first gate being coupled to the second gate for at least one of the first transistor and the fourth transistor;

an electrical contact between the drain region of the second and third transistors to provide an output for the inverter; and a gate contact, the gate contact interconnecting the transistors wherein the gate contact provides an input to the inverter.

2. The inverter of claim 1, wherein:

the first transistor is a first transistor type and has a first threshold voltage value ($V_{t1}$);

the second transistor is a first transistor type and has a second threshold voltage value ($V_{t2}$);

the third transistor is a second transistor type and has the second threshold voltage value ($V_{t2}$); and the fourth transistor is a second transistor type and has the first threshold voltage value ($V_{t1}$).

3. The inverter of claim 1, wherein:

the second gate of the first transistor couples to the first gate of the first transistor; and the second gate of the fourth transistor couples to the first gate of the fourth transistor.

4. The inverter of claim 1, wherein the first and second gates of the first and second transistors are formed of n+ silicon material, and wherein the first and second gates of the third and fourth transistors are formed of p+ silicon material.

5. The inverter of claim 1, wherein the gate contact interconnects the first gates of the transistors.

6. The inverter of claim 2, wherein:

the first transistor type is an n-channel metal-oxide semiconductor (NMOS) transistor; and the second transistor type is a p-channel metal-oxide semiconductor (PMOS) transistor.

7. The inverter of claim 2, wherein the first threshold voltage value ($V_{t1}$) of the first and fourth transistors is greater than the second threshold voltage value ($V_{t2}$) of the second and third transistors.

8. The inverter of claim 1, wherein the transistors are formed on an insulator layer formed on a p– silicon substrate.

9. The inverter of claim 1, wherein the second gates for the second and third transistors are biased independently from the first gates of the second and third transistors.

10. A logic circuit, comprising:

multiple inverters formed in an array, each inverter comprising:

a first transistor, the first transistor having a source region, a drain region, a pair of opposing sidewall surfaces, a first gate on a first one of the opposing sidewall surfaces, and a second gate on a second one of the opposing sidewall surfaces;

a second transistor, the second transistor having a source region, a drain region, a pair of opposing sidewall surfaces, a first gate on a first one of the opposing sidewall surfaces, and a second gate on a second one of the opposing sidewall surfaces, the source region of the second transistor being electrically connected to the drain region of the first transistor;

a third transistor, the third transistor having a source region, a drain region, a pair of opposing sidewall surfaces, a first gate on a first one of the opposing sidewall surfaces, and a second gate on a second one of the opposing sidewall surfaces;

a fourth transistor, the fourth transistor having a source region, a drain region, a pair of opposing sidewall surfaces, a first gate on a first one of the opposing sidewall surfaces, and having a second gate on a second one of the opposing sidewall surfaces, the drain region of the fourth transistor being electrically connected to the source region of the third transistor;

the first gate being coupled to the second gate for at least one of the first transistor and the fourth transistor;

an electrical contact between the drain region of the second and third transistors to provide an output for the inverter; and a gate contact, the gate contact interconnecting the transistors wherein the gate contact provides an input to the inverter; and a metallization layer that selectively interconnects the inputs and outputs of the inverters to implement a logic function that accepts inputs and produces one or more logical outputs.

11. The logic circuit of claim 10, wherein:

the second gate of the first transistor couples to the first gate of the first transistor; and the second gate of the fourth transistor couples to the first gate of the fourth transistor.

12. The logic circuit of claim 10, wherein the transistors are formed on an insulator layer formed on a p– silicon substrate.

13. The logic circuit of claim 10, wherein the first and fourth transistors have a higher threshold voltage value than the second and third transistors.

14. The logic circuit of claim 10, wherein the second gates for the second and third transistors are biased independently from the first gates of the second and third transistors.

15. The logic circuit of claim 10, wherein the first and second transistors are n-channel metal-oxide semiconductor (NMOS) transistors and the third and fourth transistors are p-channel metal-oxide semiconductor (PMOS) transistors.

16. An input/output device, comprising:

a functional circuit having a plurality of components;

a logic device coupled to the functional circuit, the logic device having a number of inverters, each inverter comprising:

a first transistor, the first transistor having a source region, a drain region, a pair of opposing sidewall surfaces, a first gate on a first one of the opposing sidewall surfaces, and a second gate on a second one of the opposing sidewall surfaces;

a second transistor, the second transistor having a source region, a drain region, a pair of opposing side wall surfaces, a first gate on a first one of the opposing sidewall surfaces, and a second gate on a second one of the opposing sidewall surfaces, the source region of the second transistor being electrically connected to the drain region of the first transistor;

a third transistor, the third transistor having a source region, a drain region, a pair of opposing sidewall surfaces, a first gate on a first one of the opposing sidewall surfaces, and a second gate on a second one of the opposing sidewall surfaces;

a fourth transistor, the fourth transistor having a source region, a drain region, a pair of opposing sidewall surfaces, a first gate on a first one of the opposing sidewall surfaces, and a second gate on a second one of the opposing sidewall surfaces, the drain region of the fourth transistor being electrically connected to the source region of the third transistor;

the first gate being coupled to the second gate for at least one of the first transistor and the fourth transistor;

an electrical contact between the drain region of the second and third transistors to provide an output for the inverter; and a gate contact, the gate contact interconnecting the transistors wherein the gate contact provides an input to the inverter; and a metallization layer that selectively interconnects the inputs and outputs of the inverters to form a logic circuit that accepts inputs and produces one or more logical outputs.

17. The input/output device of claim 16, wherein:

the second gate of the first transistor couples to the first gate of the first transistor; and the second gate of the fourth transistor couples to the first gate of the fourth transistor.

18. The input/output device of claim 16, wherein the first and fourth transistors have a higher threshold voltage level than the second and third transistors.

19. The input/output device of claim 16, wherein the second gates for the second and third transistors are biased independently from the first gates of the second and third transistors.

20. The input/output device of claim 16, wherein the gate contact interconnects the first gates of the transistors.

21. An inverter circuit, comprising:

a complementary pair of transistors, the complementary pair comprising a first channel type transistor and a second channel type transistor, each transistor comprising:

a body having a pair of opposing sidewalls;

a source formed on an upper surface of the body region;

a drain formed on an upper surface of the body region;

a first gate formed on a first one of the opposing sidewalls; and a second gate formed on a second one of the opposing sidewalls;

the first gate being coupled to the second gate for at least one of the transistors;

an electrical contact between the drain regions of the complementary pair to provide an output for the inverter; and a gate contact, the gate contact interconnecting the first gates of the complementary pair and wherein the gate contact comprises an input to the inverter.

22. The inverter circuit of claim 21, wherein the first channel type transistor comprises an n-channel metal-oxide semiconductor (NMOS) transistor, and wherein the second channel type transistor comprises a p-channel metal-oxide semiconductor (PMOS) transistor.

23. The inverter circuit of claim 21, wherein the first and second gates in each transistor couple to one another.

24. The inverter circuit of claim 21, further comprising an insulator layer formed between the body and the substrate.

25. An information handling system comprising:

a central processing unit;

a random access memory; and a system bus for communicatively coupling the central processing unit and the random access memory, the central processing unit (CPU) further including an inverter, the inverter further comprising:

a complementary pair of transistors, the complementary pair comprising a first channel type transistor and a second channel type transistor, each transistor comprising:

a body having a pair of opposing sidewalls;

a source formed on an upper surface of the body region;

a drain formed on an upper surface of the body region;

a first gate formed on a first one of the opposing sidewalls; and a second gate formed on a second one of the opposing sidewalls;

the first gate being coupled to the second gate for at least one of the transistors;

an electrical contact between the drain regions of the complementary pair to provide an output for the inverter; and a gate contact, the gate contact interconnecting the first gates of the complementary pair and wherein the gate contact comprises an input to the inverter.

26. The information handling system of claim 25, wherein the first channel type transistor comprises an n-channel metal-oxide semiconductor (NMOS) transistor, and wherein the second channel type transistor comprises a p-channel metal-oxide semiconductor (PMOS) transistor.

27. The information handling system of claim 25, wherein the second gate couples to the first gate in each transistor.

28. The information handling system of claim 25, each transistor further comprising an insulator layer formed between the body region and the substrate.

* * * * *

UNITED STATES PATENT AND TRADEMARK OFFICE
CERTIFICATE OF CORRECTION

PATENT NO. : 6,414,356 B1  Page 1 of 1
DATED : July 2, 2002
INVENTOR(S) : Leonard Forbes and Wendell P. Noble It is certified that error appears in the above-identified patent and that said Letters Patent is hereby corrected as shown below:

Title page,
Item [56], References Cited, OTHER PUBLICATIONS, delete "Solid State" and insert -- Solid-State --, therefor.
Delete "Solid State" and insert -- Solid-State --, therefor.

Column 1,
Line 66, delete "uses" and insert -- causes --, therefor.
Line 67, insert ". " after "current".

Column 2,
Line 46, delete "few" and insert -- first --, therefor.

Column 3,
Line 57, delete "describe" and insert -- described --, therefor.

Column 5,
Line 24, delete "fined" and insert -- defined --, therefor.

Figure 40:
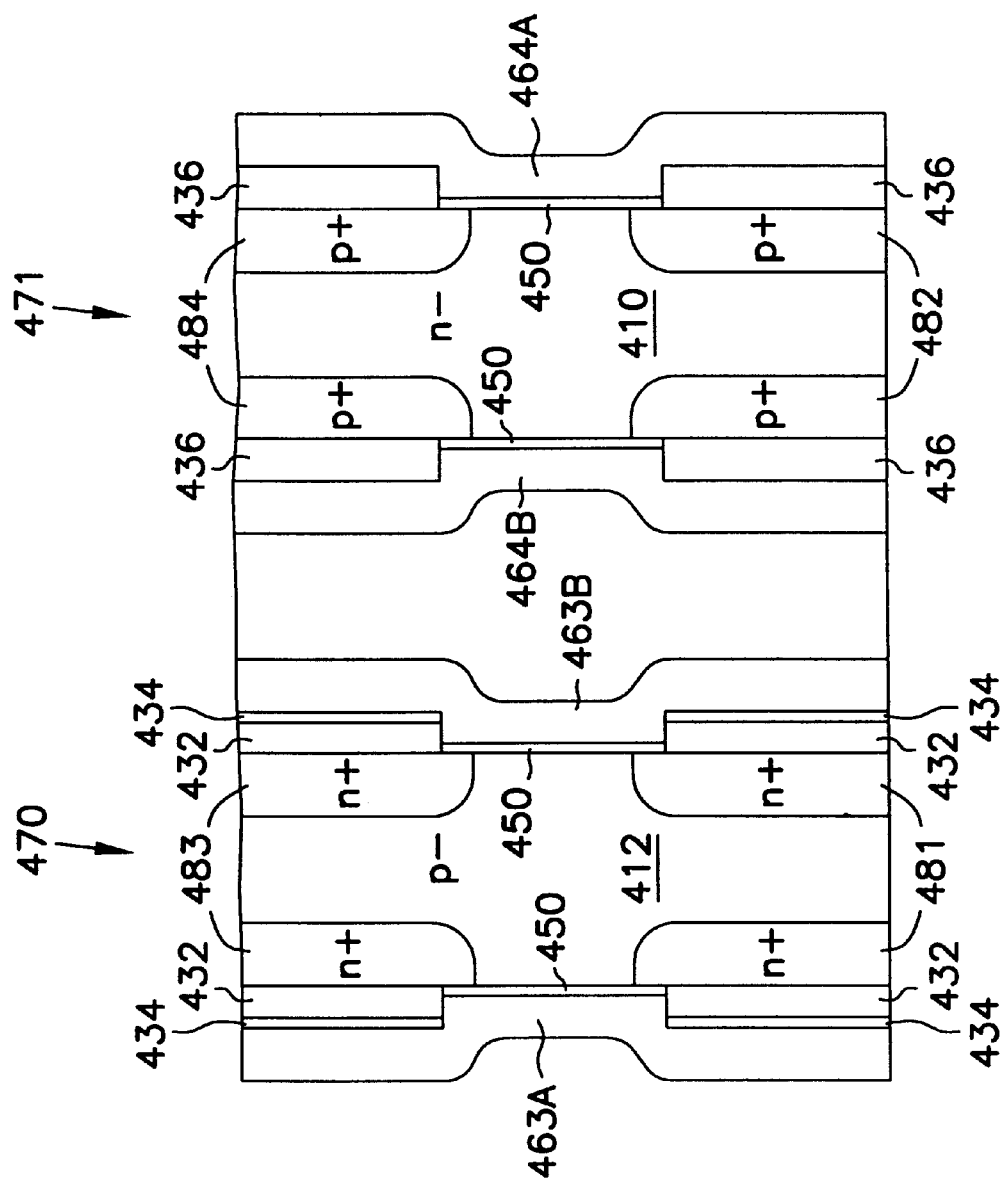

Column 12,
Line 12, insert -- . -- after "4K-4K".
Line 62, delete "FIG. 40" and insert -- FIG. 4O --, therefor.

Column 14,
Lines 46-47, delete "604 unit" and insert -- unit 604 --, therefor.

Signed and Sealed this

Twenty-eighth Day of January, 2003

JAMES E. ROGAN
*Director of the United States Patent and Trademark Office*